(12) United States Patent
Takekoshi

(10) Patent No.: US 10,665,422 B2
(45) Date of Patent: May 26, 2020

(54) ELECTRON BEAM IMAGE ACQUISITION APPARATUS, AND ELECTRON BEAM IMAGE ACQUISITION METHOD

(71) Applicant: NUFLARE TECHNOLOGY, INC., Kanagawa (JP)

(72) Inventor: Hidekazu Takekoshi, Kanagawa (JP)

(73) Assignee: NUFLARE TECHNOLOGY, INC., Kanagawa (JP)

(*) Notice: Subject to any disclaimer, the term of this patent is extended or adjusted under 35 U.S.C. 154(b) by 137 days.

(21) Appl. No.: 16/132,618

(22) Filed: Sep. 17, 2018

(65) Prior Publication Data

US 2019/0096631 A1 Mar. 28, 2019

(30) Foreign Application Priority Data

Sep. 28, 2017 (JP) ................. 2017-187690

(51) Int. Cl.
*H01J 37/26* (2006.01)
*G06T 7/00* (2017.01)
*H01J 37/22* (2006.01)
*H01J 37/28* (2006.01)

(52) U.S. Cl.
CPC ............ *H01J 37/268* (2013.01); *G06T 7/001* (2013.01); *H01J 37/22* (2013.01); *H01J 37/265* (2013.01); *H01J 37/28* (2013.01); *H01J 2237/082* (2013.01); *H01J 2237/1501* (2013.01); *H01J 2237/2817* (2013.01)

(58) Field of Classification Search
CPC ........ H01J 37/268; H01J 37/22; H01J 37/265; H01J 37/28; H01J 2237/082; H01J 2237/1501; H01J 2237/2817; G06T 7/001
See application file for complete search history.

(56) References Cited

U.S. PATENT DOCUMENTS 6,509,564 B1  1/2003  Suzuki et al.

FOREIGN PATENT DOCUMENTS

JP        2004-079516 A    3/2004

*Primary Examiner* — Nicole M Ippolito
*Assistant Examiner* — Hanway Chang
(74) *Attorney, Agent, or Firm* — Cermak Nakajima & McGowan LLP; Tomoko Nakajima

(57) ABSTRACT

An electron beam image acquisition apparatus includes a deflector to deflect an electron beam, a deflection control system to control the deflector, a measurement circuitry to measure, while moving a stage for placing thereon a substrate on which a figure pattern is formed, an edge position of a mark pattern arranged on the stage by scanning the mark pattern with an electron beam, a delay time calculation circuitry to calculate, using information on the edge position, a deflection control delay time which is a delay time to start deflection control occurring in the deflection control system, a correction circuitry to correct, using the deflection control delay time, a deflection position of the electron beam, and an image acquisition mechanism to include the deflector and acquire an image of the figure pattern at a corrected deflection position on the substrate.

10 Claims, 11 Drawing Sheets

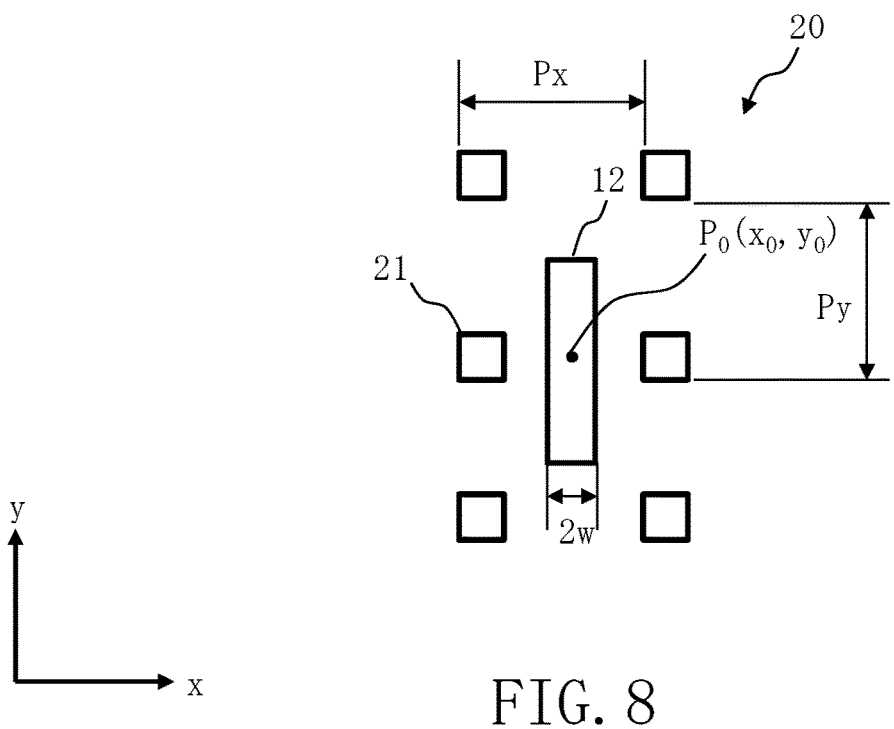
FIG. 8
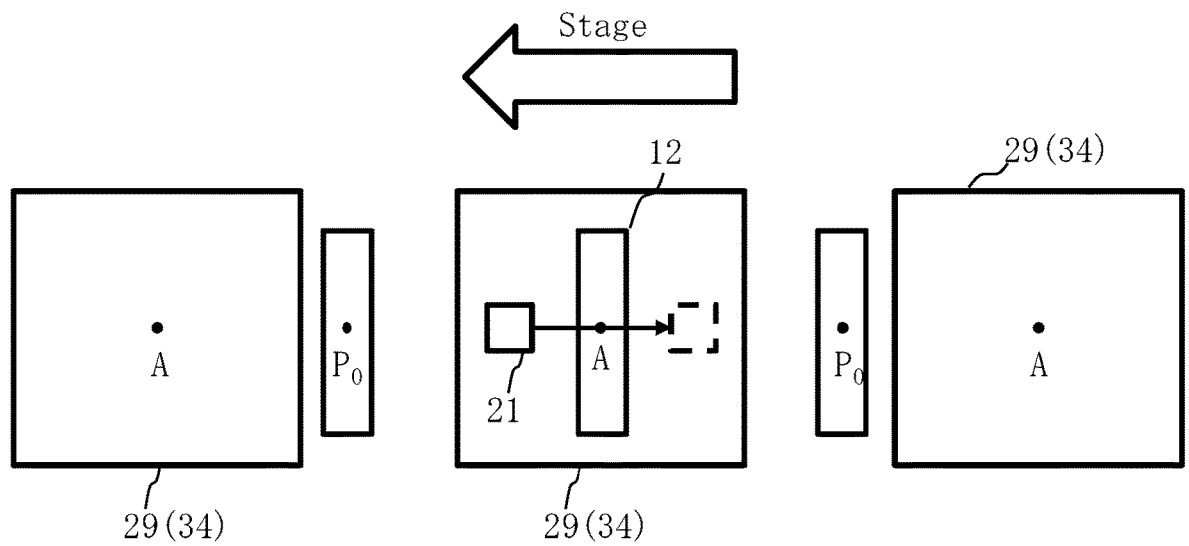
FIG. 9A  FIG. 9B  FIG. 9C
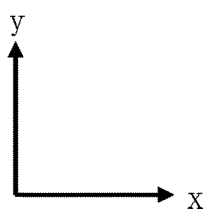

ELECTRON BEAM IMAGE ACQUISITION APPARATUS, AND ELECTRON BEAM IMAGE ACQUISITION METHOD

CROSS-REFERENCE TO RELATED APPLICATION

This application is based upon and claims the benefit of priority from prior Japanese Patent Application No. 2017-187690 filed on Sep. 28, 2017 in Japan, the entire contents of which are incorporated herein by reference.

BACKGROUND OF THE INVENTION

Field of the Invention

Embodiments of the present invention relate to an electron beam image acquisition apparatus and an electron beam image acquisition method. For example, embodiments of the present invention relate to an imaging apparatus and method of capturing images for inspection using electron beams.

Description of Related Art

In recent years, with the advance of high integration and large capacity of large-scale integration (LSI) circuits, the line width (critical dimension) required for circuits of semiconductor elements is becoming increasingly narrower. Such semiconductor elements are manufactured by forming a circuit by way of exposing and transferring a pattern onto a wafer, utilizing a reduced projection exposure apparatus known as a stepper, while using an original or "master" pattern (also called a mask or a reticle, hereinafter generically referred to as a mask) with a circuit pattern formed thereon.

Since LSI manufacturing requires a tremendous amount of manufacturing cost, it is crucial to improve its yield. However, as typified by a 1-gigabit DRAM (Dynamic Random Access Memory), the scale of patterns configuring an LSI has become on the order of nanometers from sub-microns. In recent years, with miniaturization of dimensions of LSI patterns formed on a semiconductor wafer, dimension to be detected as a pattern defect has become extremely small. Therefore, the pattern inspection apparatus for inspecting defects of ultrafine patterns transferred and exposed on the semiconductor wafer needs to be highly accurate. Further, one of major factors that decrease the yield of the LSI manufacturing is due to pattern defects on the mask used for exposing and transferring an ultrafine pattern on a semiconductor wafer by the photolithography technology. Therefore, the pattern inspection apparatus for inspecting defects on a transfer mask used in manufacturing LSI needs to be highly accurate.

As an inspection method, there is known a method of comparing a measured image captured by imaging a pattern formed on the substrate, such as a semiconductor wafer and a lithography mask, with design data, or with another measured image captured by imaging an identical pattern on the substrate. For example, the methods described below are known as pattern inspection, "die-to-die inspection" and "die-to-database inspection": the "die-to-die inspection" method compares data of measured images captured by imaging identical patterns at different positions on the same substrate; and the "die-to-database inspection" method generates design image data (reference image), based on pattern design data, to be compared with a measured image serving as measured data obtained by imaging the pattern. In such inspection methods for use in the inspection apparatus, a substrate to be inspected (an inspection target substrate) is placed on the stage so that a light flux may scan a target object as the stage moves in order to perform an inspection. Specifically, the substrate to be inspected is irradiated with a light flux from the light source through the illumination optical system. A light transmitted through the inspection substrate or reflected therefrom forms an image on a sensor through the optical system. Then, the image captured by the sensor is transmitted as measured data to the comparison circuit. After providing alignment (positioning) between images, the comparison circuit compares the measured data with the reference data in accordance with an appropriate algorithm, and determines that there is a pattern defect if the compared data are not identical.

The pattern inspection apparatus described above acquires an optical image by irradiating an inspection substrate with laser beams in order to capture a transmission image or a reflection image of a pattern formed on the substrate. On the other hand, there has been developed an inspection apparatus which acquires a pattern image by scanning an inspection substrate with electron beams in order to detect a secondary electron emitted from the inspection substrate along with the irradiation of the electron beams. When scanning with the electron beams while moving the stage, since the beam irradiation position also moves along with the stage movement, it becomes necessary to correct a beam deflection position to be corresponding to the stage position (e.g., refer to Japanese Patent Application Laid-open (JP-A) No. 2004-079516). However, there is a problem in that a deviation occurs in the beam deflection position, which causes deviation of the position of an obtained image. This problem may also occur in both the apparatus employing a single beam to acquire images, such as a scanning electron microscope (SEM), and the apparatus employing multiple beams to acquire images.

Delay of a beam deflection control may be a cause of the deviation of the deflection position described above. Even if the deflection position is made to follow the stage position having been measured, it is difficult for it to be instantly suited with the measured stage position.

BRIEF SUMMARY OF THE INVENTION

According to one aspect of the present invention, an electron beam image acquisition apparatus includes a deflector configured to deflect an electron beam, a deflection control system configured to control the deflector, a measurement circuitry configured to measure, while moving a stage for placing thereon a substrate on which a figure pattern is formed, an edge position of a mark pattern arranged on the stage by scanning the mark pattern with an electron beam, a delay time calculation circuitry configured to calculate, using information on the edge position, a deflection control delay time which is a delay time to start deflection control occurring in the deflection control system, a correction circuitry configured to correct, using the deflection control delay time, a deflection position of the electron beam, and an image acquisition mechanism configured to include the deflector and acquire an image of the figure pattern at a corrected deflection position on the substrate.

According to another aspect of the present invention, an electron beam image acquisition method includes measuring, while moving a stage to place thereon a substrate on which a figure pattern is formed, an edge position of a mark pattern arranged on the stage by scanning the mark pattern with an electron beam deflected by a deflector; calculating, using information on the edge position, a deflection control delay time which is a delay time to start deflection control occurring in a deflection control system to control the deflector; correcting a deflection position of the electron beam by using the deflection control delay time; and acquiring an image of the figure pattern at a corrected deflection position on the substrate.

BRIEF DESCRIPTION OF THE DRAWINGS

FIG. 8 shows an example of a mark according to the first embodiment;

FIGS. 9A to 9C illustrate a stage movement and a mark scanning method according to the first embodiment;

DETAILED DESCRIPTION OF THE INVENTION

Embodiments below describe an apparatus and method which can acquire an image obtained while inhibiting deviation of a beam deflection position.

Moreover, embodiments below describe, as an example of a method for capturing an image (acquiring an inspection image) of a pattern formed on an inspection substrate, the case where the inspection substrate is irradiated with multiple electron beams in order to capture a secondary electron image. However, it is not limited thereto. It is also preferable, as the method for capturing an image of a pattern formed on the inspection substrate, for example, to irradiate the inspection substrate with a single electron beam in order to capture a secondary electron image (acquire an inspection image).

First Embodiment

Figure 1:
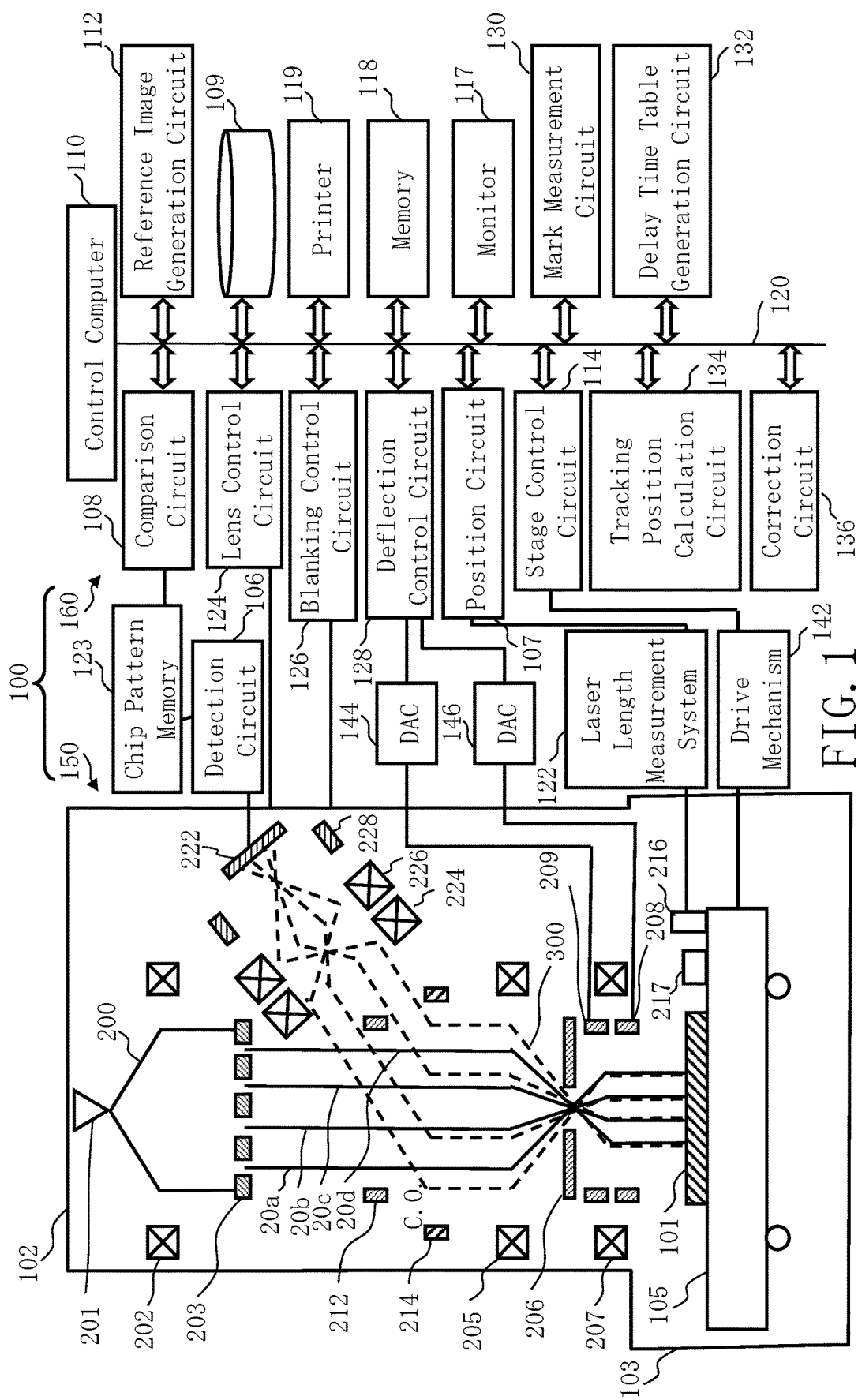
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of an electron beam inspection apparatus. Moreover, the inspection apparatus 100 is an example of an electron beam image acquisition apparatus. The inspection apparatus 100 includes an image acquisition mechanism 150 and a control system 160 (control unit). The image acquisition mechanism 150 includes an electron beam column 102 (electron optical column), an inspection chamber 103, a detection circuit 106, a chip pattern memory 123, a stage drive mechanism 142, and a laser length measurement system 122. In the electron beam column 102, there are disposed an electron gun 201, an illumination lens 202, a shaping aperture array substrate 203, a reducing lens 205, a limiting aperture substrate 206, an objective lens 207, a main deflector 208, a sub deflector 209, a common blanking deflector 212, a beam separator 214, projection lenses 224 and 226, a deflector 228, and a multi-detector 222.

In the inspection chamber 103, there is disposed an XY stage 105 movable at least in the x-y plane. On the XY stage 105, there is placed a substrate 101 to be inspected. The substrate 101 may be an exposure mask substrate, or a semiconductor substrate such as a silicon wafer. When the substrate 101 is a semiconductor substrate, a plurality of chip patterns (wafer die) is formed on the semiconductor substrate. When the substrate 101 is an exposure mask substrate, a chip pattern is formed on the exposure mask substrate. The chip pattern is configured by a plurality of figure patterns. If a chip pattern formed on the exposure mask substrate is exposure-transferred to the semiconductor substrate a plurality of times, a plurality of chip patterns (wafer die) is formed on the semiconductor substrate. Hereinafter, the case of the substrate 101 being a semiconductor substrate is mainly described below. The substrate 101 is placed with its pattern forming surface facing upward, on the XY stage 105, for example. Moreover, on the XY stage 105, there is arranged a mirror 216 which reflects a laser beam for measuring a laser length emitted from the laser length measurement system 122 disposed outside the inspection chamber 103. Moreover, on the XY stage 105, there is arranged a mark stage 217 on which a mark to be described later is formed. The height positions of the surface of the mark stage 217 and the surface of the substrate 101 are substantially flush with one another. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a mark measurement circuit 130, a delay time table generation circuit 132, a tracking position calculation circuit 134, a correction circuit 136, a storage device 109 such as a magnetic disk drive, a monitor 117, a memory 118, and a printer 119. Moreover, the deflection control circuit 128 is connected to DAC (digital-to-analog conversion) amplifiers 144 and 146. The DAC amplifier 146 is connected to the main deflector 208, and the DAC amplifier 144 is connected to the sub deflector 209.

The chip pattern memory 123 is connected to the comparison circuit 108. The XY stage 105 is driven by the stage drive mechanism 142 under the control of the stage control circuit 114. In the drive mechanism 142, the XY stage 105 can be moved by a drive system, such as a three (x-, y-, and θ-) axis motor, which drives the stage in the directions of x, y, and θ. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measurement system 122, and supplied (transmitted) to the position circuit 107. The laser length measurement system 122 measures the position of the XY stage 105 by receiving a reflected light from the mirror 216, based on the principle of laser interferometry.

To the electron gun 201, there is connected a high voltage power supply circuit (not shown). The high voltage power supply circuit applies an acceleration voltage between the filament and the extraction electrode (anode) (which are not shown) in the electron gun 201. In addition to applying the acceleration voltage as described above, by applying a voltage to a predetermined extraction electrode (Wehnelt) and heating the cathode at a predetermined temperature, electrons emitted from the cathode are accelerated and emitted as an electron beam 200. For example, electromagnetic lenses are used as the illumination lens 202, the reducing lens 205, the objective lens 207, and the projection lenses 224 and 226, and all of them are controlled by the lens control circuit 124. The beam separator 214 is also controlled by the lens control circuit 124. Each of the common blanking deflector 212 and the deflector 228 is composed of electrodes of at least two poles, and controlled by the blanking control circuit 126. The main deflector 208 is composed of electrodes of at least four poles, and controlled by the deflection control circuit 128 through the DAC amplifier 146 disposed for each electrode. Similarly, the sub deflector 209 is composed of electrodes of at least four poles, and controlled by the deflection control circuit 128 through the DAC amplifier 144 arranged for each electrode.

FIG. 1 shows configuration elements necessary for describing the first embodiment. It should be understood that other configuration elements generally necessary for the inspection apparatus 100 may also be included therein.

Figure 2:
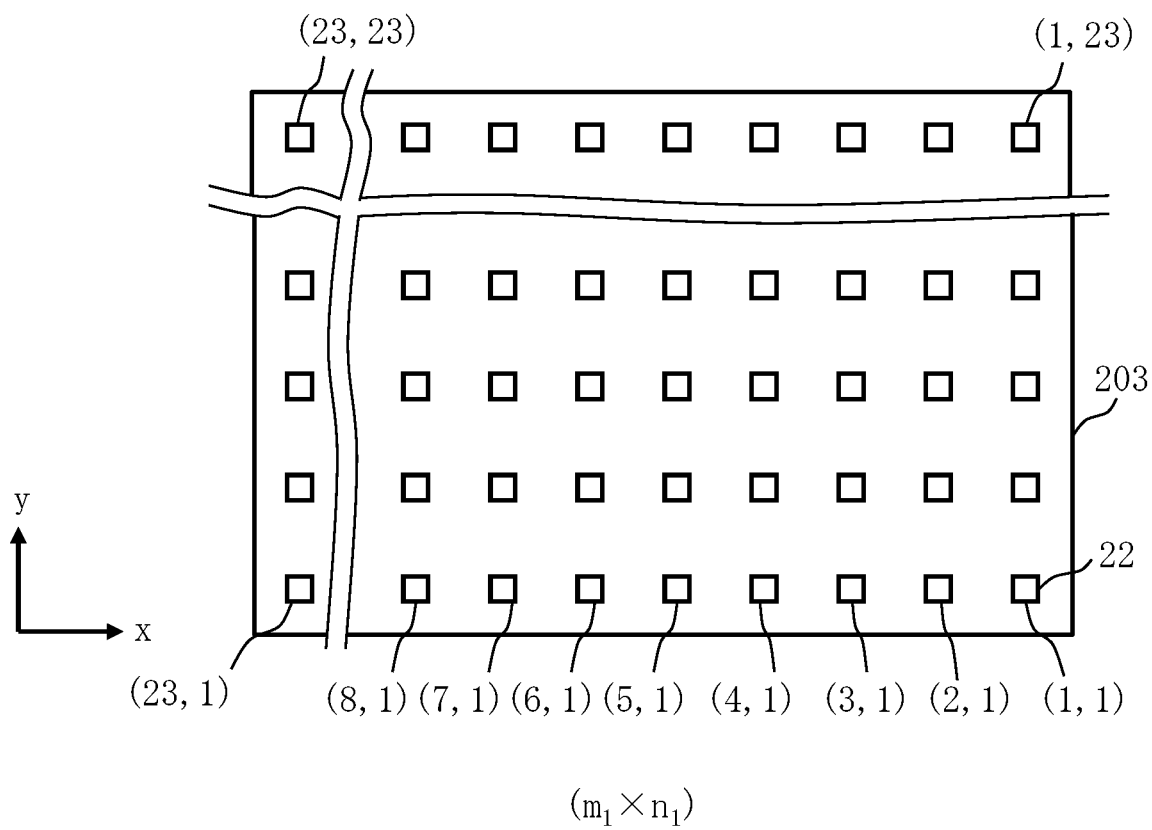
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (x direction) and $n_1$ rows long (y direction) are two-dimensionally formed at a predetermined arrangement pitch in the shaping aperture array substrate 203, where $m_1$ and $n_1$ are integers of 2 or greater. In FIG. 2, for example, holes 22 of 23 (columns in x direction)×23 (rows in y direction) are formed. Each of the holes 22 is a quadrangle having the same dimension, shape, and size. Alternatively, each of the holes 22 may be a circle with the same outer diameter. The multiple beams 20 are formed by letting portions of the electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the k-th and the (k+1)th rows which are arrayed in the length direction (y direction) and each of which is in the x direction, each hole in the k-th row and each hole in the (k+1)th row may be mutually displaced in the width direction (x direction) by a dimension "a". Similarly, with respect to the (k+1)th and the (k+2)th rows which are arrayed in the length direction (y direction) and each of which is in the x direction, each hole in the (k+1)th row and each hole in the (k+2)th row may be mutually displaced in the width direction (x direction) by a dimension "b".

Using the multiple beams 20 each being an electron beam, the image acquisition mechanism 150 acquires an image of a figure pattern, to be inspected, from the substrate 101 on which figure patterns are formed. Hereinafter, operations of the image acquisition mechanism 150 in the inspection apparatus 100 are described.

The electron beam 200 emitted from the electron gun 201 (emission source) almost perpendicularly (e.g., vertically) illuminates the whole of the shaping aperture array substrate 203 by the illumination lens 202. As shown in FIG. 2, a plurality of quadrangular (rectangular) holes 22 (openings) are formed in the shaping aperture array substrate 203. The region including all the plurality of holes 22 is irradiated by the electron beam 200. For example, a plurality of quadrangular electron beams (multiple beams) 20a to 20d (solid lines in FIG. 1) are formed by making portions of the electron beam 200, which irradiate the positions of a plurality of holes 22, individually pass through a corresponding one of the plurality of holes 22 in the shaping aperture array substrate 203.

Then, the multiple beams 20a to 20d form a crossover (C.O.). After having passed through the beam separator 214 disposed at the crossover position of each beam of the multiple beams 20, the multiple beams 20a to 20d are reduced by the reducing lens 205, and travel toward the center hole of the limiting aperture substrate 206. At this stage, when being collectively deflected by the common blanking deflector 212 placed between the shaping aperture array substrate 203 and the reducing lens 205, the multiple beams 20a to 20d deviate from the center hole of the limiting aperture substrate 206 so as to be blocked by the limiting aperture substrate 206. On the other hand, the multiple beams 20a to 20d which were not deflected by the common blanking deflector 212 pass through the center hole of the limiting aperture substrate 206 as shown in FIG. 1. Blanking control is provided by ON/OFF of the common blanking deflector 212 to collectively control ON/OFF of the beams. Thus, the limiting aperture substrate 206 blocks the multiple beams 20a to 20d which were deflected to be in the OFF condition by the common blanking deflector 212. Then, the multiple beams 20a to 20d for inspection are formed by the beams having been made during a period from becoming "beam ON" to becoming "beam OFF" and having passed through the limiting aperture substrate 206. The multiple beams 20a to 20d having passed through the limiting aperture substrate 206 are focused on the substrate 101 by the objective lens 207 to be a pattern image (beam diameter) of a desired reduction ratio. Then, the whole multiple beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 to the reference position of the mask die to be scanned by the multiple beams 20. According to the first embodiment, scanning is performed while continuously moving the XY stage 105. Therefore, the main deflector 208 performs tracking deflection to follow the movement of the XY stage 105. Then, the sub deflector 209 collectively deflects all of the multiple beams 20 so that each beam may scan a corresponding region. Ideally, the multiple beams 20 irradiating at a time are aligned at the pitch obtained by multiplying the arrangement pitch of a plurality of holes 22 in the shaping aperture array substrate 203 by the desired reduction ratio (1/a) described above. Thus, the electron beam column 102 irradiates the substrate 101 with two-dimensional $m_1 \times n_1$ multiple beams 20 at a time. A flux of secondary electrons (multiple secondary electrons 300) (dotted lines in FIG. 1) including reflected electrons, corresponding to each beam of the multiple beams 20, is emitted from the substrate 101 due to that desired positions on the substrate 101 are irradiated with the multiple beams 20.

The multiple secondary electrons 300 emitted from the substrate 101 are refracted toward the center of the multiple secondary electrons 300 by the objective lens 207, and travel toward the center hole of the limiting aperture substrate 206. The multiple secondary electrons 300 having passed through the limiting aperture substrate 206 are refracted almost parallel to the optical axis by the reducing lens 205, and travel to the beam separator 214.

The beam separator 214 generates an electric field and a magnetic field to be orthogonal to each other in a plane orthogonal to the traveling direction (optical axis) of the multiple beams 20. The electric field exerts a force in a fixed direction regardless of the traveling direction of electrons. In contrast, the magnetic field exerts a force according to Fleming's left-hand rule. Therefore, the direction of force acting on electrons can be changed depending on the entering direction of an electron. With respect to the multiple beams 20 (primary electron beams) entering the beam separator 214 from the upper side, since the force due to the electric field and the force due to the magnetic field cancel each other out, the multiple beams 20 travel straight downward. On the other hand, with respect to the multiple secondary electrons 300 entering the beam separator 214 from the lower side, since both the force due to the electric field and the force due to the magnetic field are exerted in the same direction, the multiple secondary electrons 300 are bent obliquely upward.

The multiple secondary electrons 300 bent obliquely upward are projected onto the multi-detector 222 while being refracted by the projection lenses 224 and 226. The multi-detector 222 detects the projected multiple secondary electrons 300. The multi-detector 222 includes a diode type two-dimensional sensor (not shown). Then, at the position of the diode type two-dimensional sensor corresponding to each beam of the multiple beams 20, each secondary electron of the multiple secondary electrons 300 collides with the diode type two-dimensional sensor to produce an electron, and generate secondary electron image data for each pixel to be described later. Since scanning is performed while continuously moving the XY stage 105, tracking deflection is provided as described above. Being coincident with the movement of the deflection position along with the tracking deflection, the deflector 228 deflects the multiple secondary electrons 300 so that they may irradiate respective desired positions on the light receiving surface of the multi-detector 222.

Figure 3:
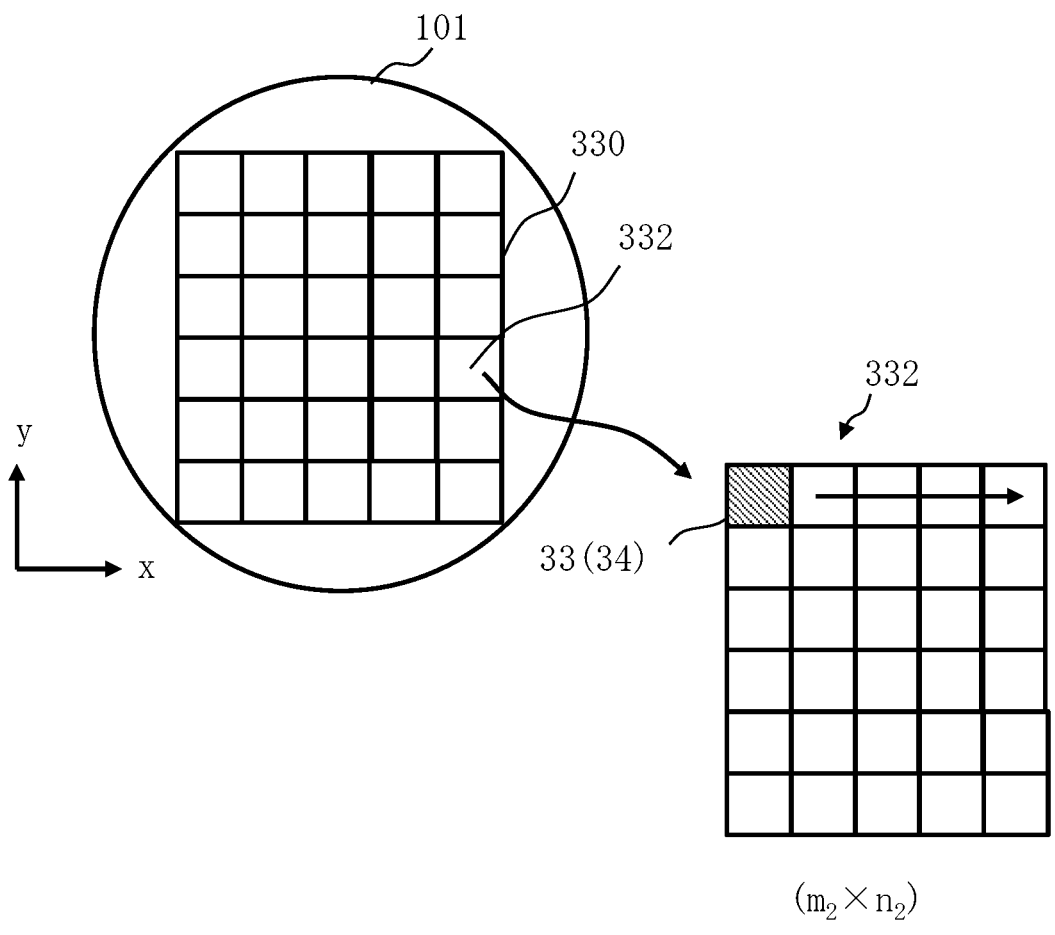
FIG. 3 shows an example of a plurality of chip regions formed on a semiconductor substrate according to the first embodiment.

FIG. 3 shows an example of a plurality of chip regions formed on a semiconductor substrate according to the first embodiment. In FIG. 3, when the substrate 101 is a semiconductor substrate (wafer), a plurality of chips (wafer die) 332 in a two-dimensional array are formed in an inspection region 330 of the semiconductor substrate 101. A mask pattern for one chip formed on the exposure mask substrate is reduced to ¼, for example, and exposed/transferred onto each chip 332 by an exposure device (stepper) (not shown).

The inside of each chip 332 is divided into a plurality of mask dies 33 of $m_2$ columns wide (width in the x direction) and $n_2$ rows long (length in the y direction) (each of $m_2$ and $n_2$ is an integer of 2 or greater), for example. In the first embodiment, the mask die 33 serves as a unit inspection region.

Figure 4:
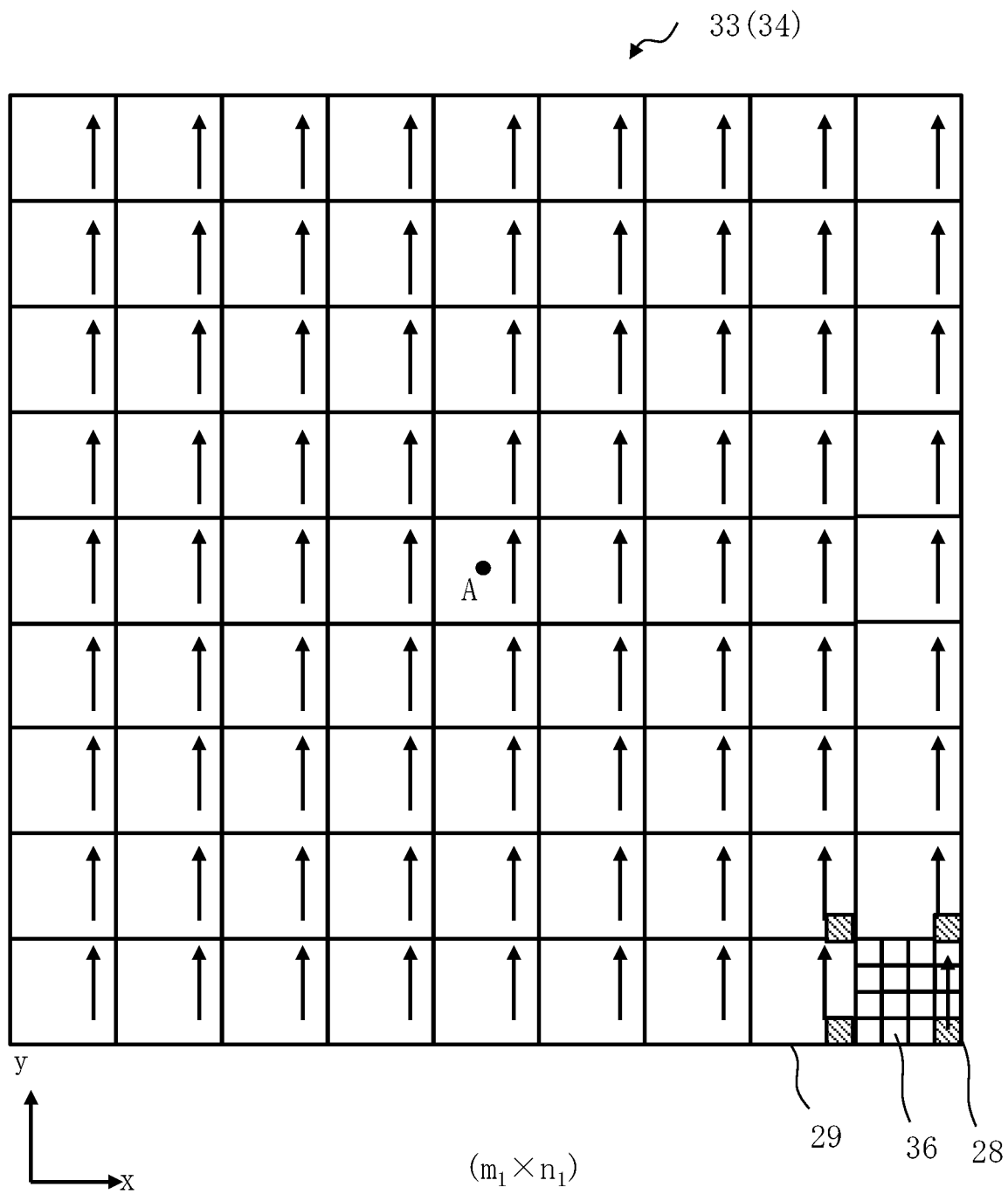
FIG. 4 shows an example of an irradiation region of multiple beams and a measurement pixel according to the first embodiment.

FIG. 4 shows an example of an irradiation region of multiple beams and a measurement pixel according to the first embodiment. In FIG. 4, each mask die 33 is divided into a plurality of mesh regions, for example, by the size of each beam of multiple beams. Each mesh region serves as a measurement pixel 36 (unit irradiation region). FIG. 4 shows the case of multiple beams of 8×8 (rows by columns). The size of the irradiation region 34 that can be irradiated with one irradiation of the multiple beams 20 is defined by (x direction size obtained by multiplying pitch between beams in x direction of the multiple beams 20 on the substrate 101 by the number of beams in the x direction)×(y direction size obtained by multiplying pitch between beams in y direction of the multiple beams 20 on the substrate 101 by the number of beams in the y direction). In the case of FIG. 4, the irradiation region 34 and the mask die 33 are of the same size. However, it is not limited thereto. The irradiation region 34 may be smaller than the mask die 33, or larger than it. In the irradiation region 34, there are shown a plurality of measurement pixels 28 (irradiation positions of beams of one shot) which can be irradiated with one irradiation of the multiple beams 20. In other words, the pitch between adjacent measurement pixels 28 serves as the pitch between beams of the multiple beams. In the example of FIG. 4, one sub-irradiation region 29 is a square region surrounded at four corners by four adjacent measurement pixels 28, and including one of the four measurement pixels 28. In the example of FIG. 4, each sub-irradiation region 29 is composed of 4×4 pixels 36.

In the scanning operation according to the first embodiment, scanning is performed for each mask die 33. FIG. 4 shows an example of the case of scanning one mask die 33. When all of the multiple beams 20 are used, there are arranged $m_1 \times n_1$ sub-irradiation regions 29 in the x and y directions (two-dimensionally) in one irradiation region 34. The XY stage 105 is moved to a position where the first mask die 33 can be irradiated with the multiple beams 20. While the main deflector 208 performs tracking deflection to follow the movement of the XY stage 105, the sub deflector 209 scans the inside of the mask die 33 concerned, regarding the mask die 33 concerned as the irradiation region 34, in the state of being tracking-deflected. Each of the multiple beams 20 is associated with any one of the sub-irradiation regions 29 which are different from each other. At the time of each shot, each beam irradiates one measurement pixel 28 corresponding to the same position in the associated sub-irradiation region 29. In the case of FIG. 4, the sub deflector 209 performs deflection such that the first shot of each beam irradiates the first measurement pixel 36 from the right in the bottom row in the sub-irradiation region 29 concerned. Thus, irradiation of the first shot is performed. Then, the beam deflection position is shifted in the y direction by the amount of one measurement pixel 36 by collectively deflecting all of the multiple beams 20 by the sub deflector 209, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the beam deflection position is shifted to the second measurement pixel 36 from the right in the bottom row by collectively deflecting all of the multiple beams 20 by the sub deflector 209. Similarly, the measurement pixels 36 are irradiated in order in the y directions. By repeating this operation, one beam irradiates all the measurement pixels 36 in order in one sub-irradiation region 29. With respect to one shot, the multiple secondary electrons 300 corresponding to a plurality of beam shots whose maximum number is the same as the number of a plurality of holes 22 are detected at a time by the multiple beams formed by passing through the plurality of holes 22 in the shaping aperture array substrate 203.

As described above, the whole multiple beams 20 scans the mask die 33 as the irradiation region 34, and that is, each beam individually scans one corresponding sub-irradiation region 29. After scanning one mask die 33 is completed, the irradiation region 34 is moved to a next adjacent mask die 33 in order to scan the next adjacent mask die 33. This operation is repeated to proceed scanning of each chip 332. Due to shots of the multiple beams 20, secondary electrons are emitted from the irradiated measurement pixels 36 at each shot time to be detected by the detector 222. According to the first embodiment, the detector 222 detects the secondary electron emitted upward from each measurement pixel 36, for each measurement pixel 36 (or each sub-irradiation region 29) as a unit detection region size.

By performing scanning using the multiple beams 20 as described above, the scanning operation (measurement) can be performed at a higher speed than scanning by a single beam. The scanning of each mask die 33 may be performed by the "step and repeat" operation, alternatively it may be performed by continuously moving the XY stage 105. When the irradiation region 34 is smaller than the mask die 33, the scanning operation may be performed while moving the irradiation region 34 in the mask die 33 concerned.

When the substrate 101 is an exposure mask substrate, the chip region for one chip formed on the exposure mask substrate is divided into a plurality of stripe regions in a strip form in the size of the mask die 33 described above. Then, for each stripe region, scanning is performed for each mask die 33 in the same way as described above. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning operation for one chip increases (e.g., four times). Since a pattern for one chip is formed on the exposure mask substrate, the number of times of scanning can be less compared to the case of the semiconductor substrate on which more than four chips are formed.

As described above, using the multiple beams 20, the image acquisition mechanism 150 scans the substrate 101 to be inspected, on which a figure pattern is formed, and detects the multiple secondary electrons 300 emitted from the inspection substrate 101 due to irradiation of the multiple beams 20 on the inspection substrate 101. Detected data on a secondary electron (measured image: secondary electron image: image to be inspected) from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, when the detected data for one chip 332 has been accumulated, the accumulated data is transmitted as chip pattern data to the comparison circuit 108, transmitted with information on each position from the position circuit 107.

In electron beam inspection, as described above, when acquiring images while continuously moving the XY stage 105, the beam irradiation position needs to be corrected (perform tracking control) according to the stage position. However, it is difficult for the main deflector 208 to make the deflection position of the multiple beams 20 be instantly suited with the tracking deflection position of the multiple beams obtained from the stage position at the moment being measured by the laser length measuring system 122. Therefore, there occurs a time lag being a delay of a beam deflection control. The delay of beam deflection control may be different depending on the movement direction of the XY stage 105. Accordingly, taking this point into consideration, it is necessary to accurately grasp the deflection control delay. Then, a method for precisely obtaining the deflection control delay time by using the mark on the mark stage 217 is now described in the first embodiment.

Figure 5:
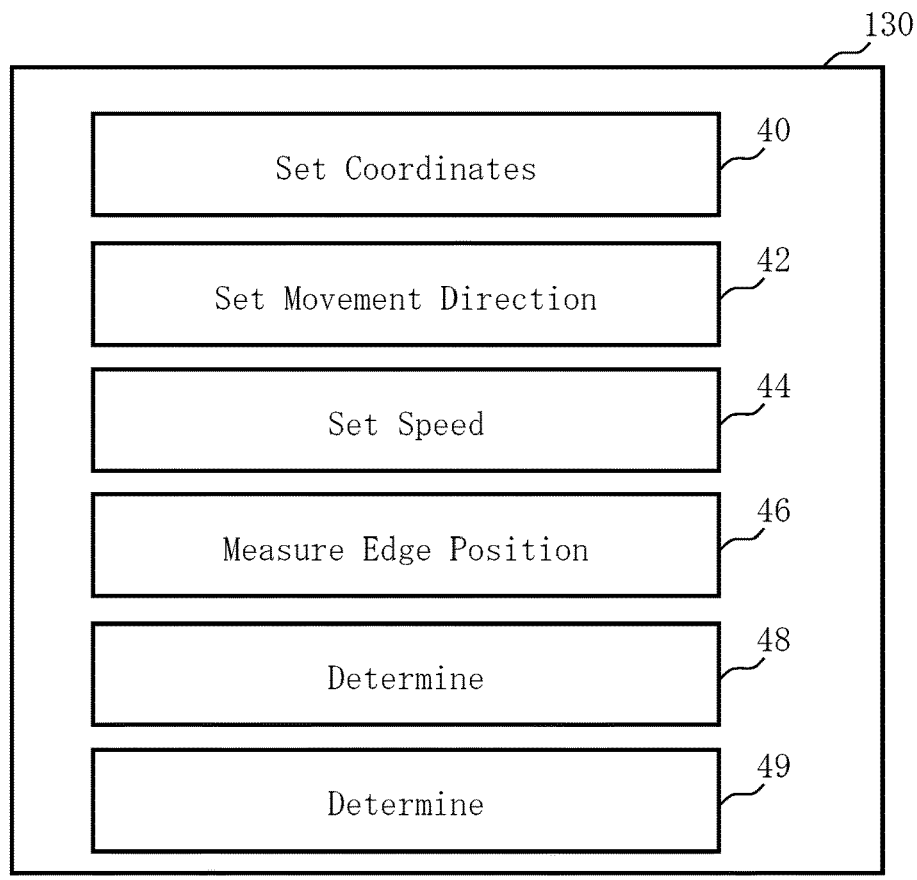
FIG. 5 shows an example of an internal configuration of a mark measurement circuit according to the first embodiment.

FIG. 5 shows an example of an internal configuration of a mark measurement circuit according to the first embodiment. In FIG. 5, a coordinate setting unit 40, a movement direction setting unit 42, a speed setting unit 44, an edge position measurement unit 46, and determination units 48 and 49 are disposed in the mark measurement circuit 130. Each of the "units" such as the coordinate setting unit 40, the movement direction setting unit 42, the speed setting unit 44, the edge position measurement unit 46, and the determination units 48 and 49 includes a processing circuitry. As the processing circuitry, for example, an electric circuit, computer, processor, circuit board, quantum circuit, or semiconductor device may be used. Each of the "units" may use a common processing circuitry (same processing circuitry), or different processing circuitries (separate processing circuitries). Input data required in the coordinate setting unit 40, the movement direction setting unit 42, the speed setting unit 44, the edge position measurement unit 46, and the determination units 48 and 49, and calculated results are stored in a memory (not shown) each time.

Figure 6:
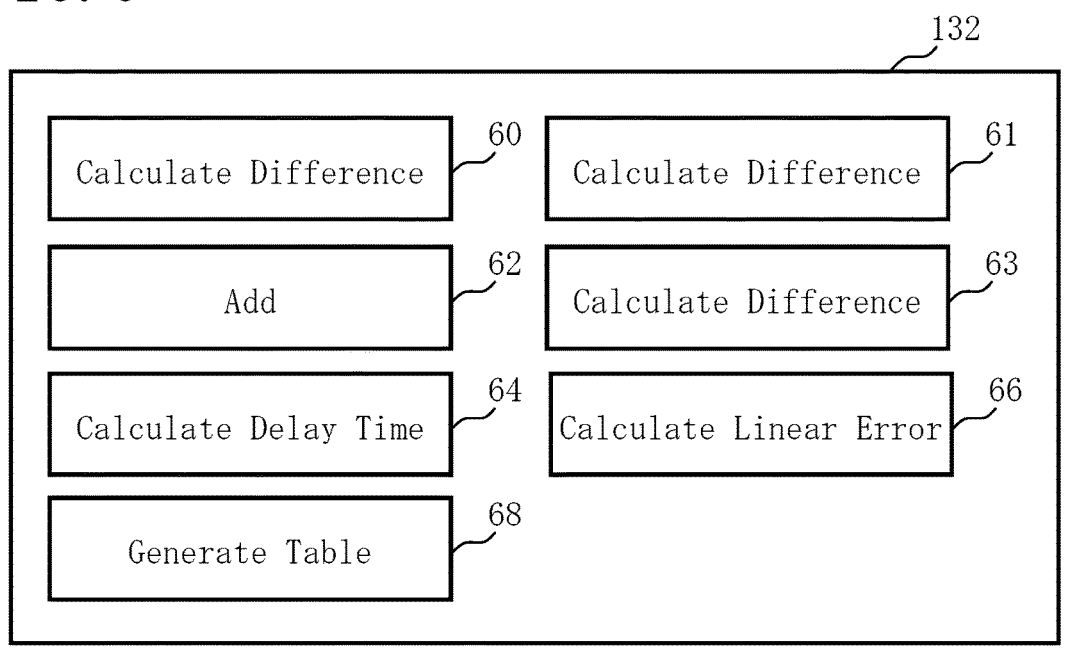
FIG. 6 shows an example of an internal configuration of a delay time table generation circuit according to the first embodiment.

FIG. 6 shows an example of an internal configuration of a delay time table generation circuit according to the first embodiment. In FIG. 6, difference calculation units 60, 61, and 63, an addition unit 62, a delay time calculation unit 64, a table generation unit 68, and a linear error calculation unit 66 are arranged in the delay time table generation circuit 132. Each of the "units" such as the difference calculation units 60, 61 and 63, the addition unit 62, the delay time calculation unit 64, the table generation unit 68, and the linear error calculation unit 66 includes a processing circuitry. As the processing circuitry, for example, an electric circuit, computer, processor, circuit board, quantum circuit, or semiconductor device may be used. Each of the "units" may use a common processing circuitry (same processing circuitry), or different processing circuitries (separate processing circuitries). Input data required in the difference calculation units 60, 61, and 63, the addition unit 62, the delay time calculation unit 64, the table generation unit 68, and the linear error calculation unit 66, and calculated results are stored in a memory (not shown) each time.

Figure 7:
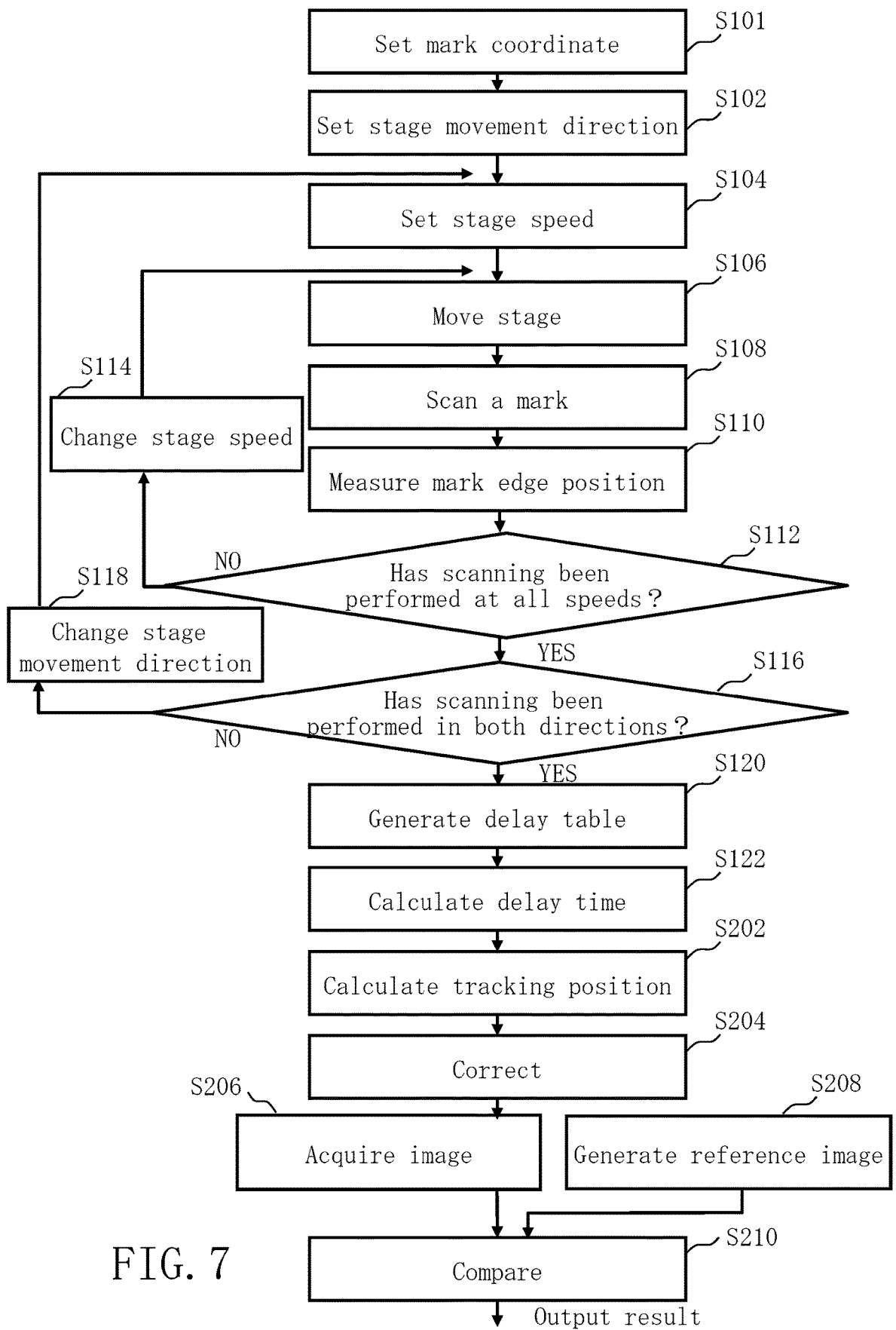
FIG. 7 is a flowchart showing main steps of an inspection method according to the first embodiment.

FIG. 7 is a flowchart showing main steps of an inspection method according to the first embodiment. In FIG. 7, the inspection method of the first embodiment executes a series of steps: a mark coordinate setting step (S101), a stage movement direction setting step (S102), a stage speed setting step (S104), a stage moving step (S106), a mark scanning step (S108), a mark edge position measuring step (S110), a determining step (S112), a stage speed changing step (S114), a determining step (S116), a stage movement direction changing step (S118), a delay table generating step (S120), a delay time calculating step (S122), a tracking position calculating step (S202), a correcting step (S204), an image acquiring step (S206), a reference image generating step (S208), and a comparing step (S210).

With respect to the steps described above, an electron beam image acquisition method according to the first embodiment executes a series of steps: the mark coordinate setting step (S101), the stage movement direction setting step (S102), the stage speed setting step (S104), the stage moving step (S106), the mark scanning step (S108), the mark edge position measuring step (S110), the determining step (S112), the stage speed changing step (S114), the determining step (S116), the stage movement direction changing step (S118), the delay table generating step (S120), the delay time calculating step (S122), the tracking position calculating step (S202), the correcting step (S204), and the image acquiring step (S206).

In the mark coordinate setting step (S101), the coordinate setting unit 40 sets mark coordinates formed on the mark stage 217.

FIG. 8 shows an example of a mark according to the first embodiment. FIG. 8 shows a portion on the mark stage 217. In the example of FIG. 8, the irradiation position of 2×3 beams 21 in the multiple beams 20 and a mark pattern 12 are shown on the mark stage 217. In FIG. 8, as the mark pattern 12, there is formed an isolated line pattern of the size smaller than the pitch Px between beams in the x direction of the multiple beams 20. In the case of FIG. 8, when the XY stage 105 moves in the ±x direction, an isolated line pattern extending in the direction orthogonal to the stage movement direction is used as the mark pattern 12. The width in the x direction of the mark pattern 12 is configured to be 2W, which is a value less than the pitch Px between beams in the x direction of the multiple beams 20, and the length in the y direction of the mark pattern 12 is configured to be less than twice the pitch Py between beams in the y direction of the multiple beams 20. When scanning the mark pattern 12 of that size in the ±x direction using the multiple beams 20, it is sufficient to use one beam for the scanning. In other words, it can be scanned with one beam so that it may not be scanned with a plurality of beams. For example, the center position $P_0(x_0, y_0)$ of the mark pattern 12 may be used as the mark coordinates. Since the x coordinate (coordinate in the stage movement direction) is mainly needed as the mark coordinate, the y coordinate position may be deviated from the center of the mark pattern 12.

In the stage movement direction setting step (S102), the movement direction setting unit 42 sets the movement direction of the XY stage 105 in the case of scanning the mark pattern 12. Here, since it is on the assumption that the XY stage 105 moves in the ±x direction, for example, +x direction or −x direction is set.

In the stage speed setting step (S104), the speed setting unit 44 sets the continuous movement speed of the XY stage 105. Since the mark pattern 12 is scanned while making the movement speed of the continuously moving XY stage 105 variable, here, one in a plurality of preset movement speeds is set.

In the stage moving step (S106), under the control of the stage control circuit 114, the drive mechanism 142 continuously moves (constant speed movement) the XY stage 105 in a set direction. The XY stage 105 is moved beforehand at a constant speed in a set direction from the position where the center of the deflection coordinate system of the multiple beams 20, that is the center A of the irradiation region 34 of the multiple beams 20 as shown in FIG. 4 can pass over the mark pattern 12.

FIGS. 9A to 9C illustrate a stage movement and a mark scanning method according to the first embodiment. The examples of FIG. 9A to 9C show positional relationship between the mark pattern 12 and the sub-irradiation region 29 to be irradiated with the center beam of the multiple beams 20 which can irradiate the center A of the irradiation region 34 of the multiple beams 20 when the XY stage 105 moves in the −x direction at a constant speed v. FIG. 9A shows the state where the mark pattern 12 is located away in the x direction from the sub-irradiation region 29 to be irradiated with the center beam 21 including the center A. If the XY stage 105 moves in the −x direction at the constant speed v from the state of FIG. 9A, there comes a moment when the center A becomes coincident with the center position $P_0(x_0, y_0)$ of the mark pattern 12 as shown in FIG. 9B. Then, due to further movement of the XY stage 105, the mark pattern 12 moves to the position away in the −x direction from the sub-irradiation region 29 corresponding to the center beam 21 including the center A as shown in FIG. 9C.

Here, the beam deflection control system composed of a tracking control system and a beam position control system. The coordinate system of the beam deflection control system shall be satisfied (established) by (the tracking control coordinate system+the beam position control coordinate system). The origin of the tracking control coordinate system and that of the beam position control coordinate system shall be coincident with each other. When the center position $P_0(x_0, y_0)$ of the mark pattern 12 becomes coincident with the center of the deflection coordinate system of the multiple beams 20, that is, the center A of the irradiation region 34 of the multiple beams 20, the deflection control circuit 128 starts deflection control of the multiple beams 20 collectively so that the center beam of the multiple beams 20 may be deflected onto the center A of the irradiation region 34 by using the DAC amplifier 144. When starting the deflection control based on interferometer data of the laser length measuring system 122, in the deflection coordinate system of the multiple beams 20, the center position P(t) of the mark pattern 12 after t seconds can be defined by the following equation (1).

$$P(t)=P_0+v \cdot t \quad (1)$$

The left edge position PL (t) and the right edge position PR(t) of the mark pattern 12, whose width is 2W, after t seconds can be defined by the following equations (2-1) (left edge) and (2-2) (right edge).

$$PL(t)=P_0+v \cdot t-W \quad (2\text{-}1)$$

$$PR(t)=P_0+v \cdot t+W \quad (2\text{-}2)$$

Figure 10:
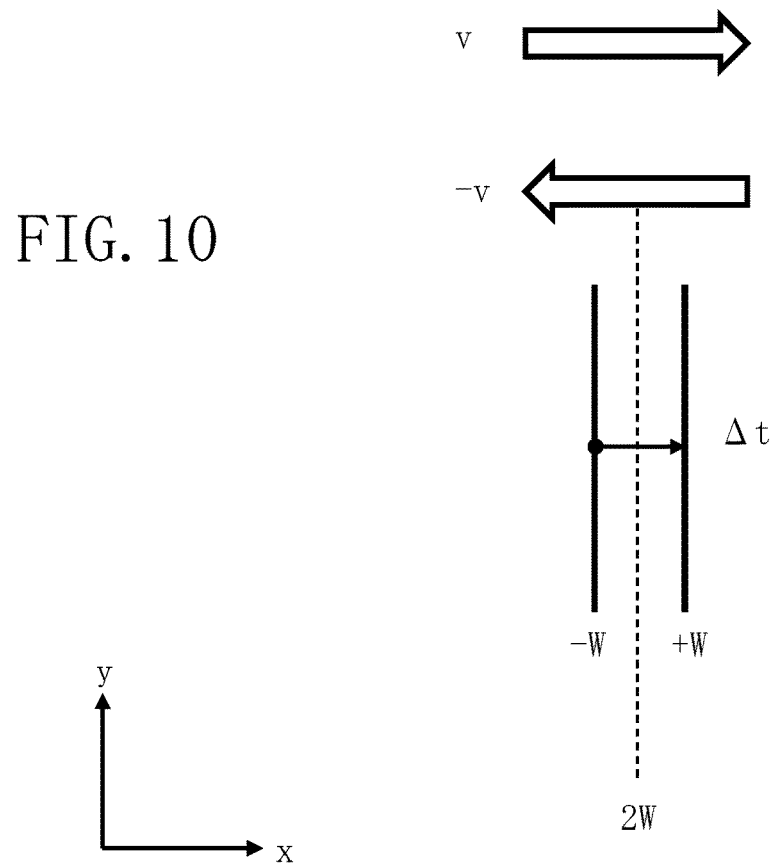
FIG. 10 illustrates a movement speed and a scanning time in the deflection coordinate system for detecting right and left edge positions of a mark pattern.

FIG. 10 illustrates a movement speed and a scanning time in the deflection coordinate system for detecting right and left edge positions of a mark pattern. In FIG. 10, when the XY stage 105 moves in the −x direction at the constant speed v, the right and left edge positions relatively move in the +x direction at the constant speed v (positive direction). In contrast, when the XY stage 105 moves in the +x direction at the constant speed v, the right and left edge positions relatively move in the −x direction at the constant speed v (reverse (negative) direction). In order to detect the right and left (x direction) edge positions of the mark pattern 12 having the width 2W, the DAC amplifier 146 needs to scan the distance longer than the width 2W of the mark pattern 12. This scanning time is determined based on a pixel size and a dwell time per pixel. Here, if the time to scan the distance 2W by the center beam is defined to be $\Delta t$ and the scanning direction is +x direction (positive direction), when the left edge is irradiated with the beam after a time t1 has passed since the deflection control described above started, and the right edge is irradiated with the beam after $\Delta t$ has passed since t1, the left edge position PL(t1, v) and the right edge position PR(t1+$\Delta t$, v) can be defined by the following equations (3-1) (left edge) and (3-2) (right edge) in the deflection coordinate system of the multiple beams 20.

$$PL(t1,v)=P_0+v \cdot t1-W \qquad (3\text{-}1)$$

$$PR(t1+\Delta t,v)=P_0+v \cdot (t1+\Delta t)+W \qquad (3\text{-}2)$$

On the other hand, in the actual inspection apparatus 100, a deflection control delay time $\alpha$ from acquiring position data by the laser length measuring system 122 to actually starting a deflection control, a linear error coefficient Te of the DAC amplifier 144 for tracking control, and a linear error De of the DAC amplifier 146 for deflecting the beam position are included in the position of the target point in the deflection coordinate system of the multiple beams 20. Therefore, when the XY stage 105 moves in the −x direction at the constant speed v (positive direction), the equation (3-1) (left edge) can be defined by the following equation (4-1) (left edge). Similarly, the equation (3-2) (right edge) can be defined by the following equation (4-2) (right edge).

$$PL(t1,v)=P_0 \cdot Te+v \cdot t1 \cdot Te+\alpha v-W \cdot De \qquad (4\text{-}1)$$

$$PR(t1+\Delta t,v)=P_0 \cdot Te+v \cdot (t1+\Delta t) \cdot Te+\alpha \cdot v+W \cdot De \qquad (4\text{-}2)$$

Therefore, when the XY stage 105 moves in the −x direction at the constant speed v (positive direction), the difference between the right and left edges ([right edge]−[left edge]) can be defined by the following equation (5). The sum of the right and left edges can be defined by the following equation (6).

$$PR(t1+\Delta t,v)-PL(t1,v)=v \cdot \Delta t \cdot Te+2W \cdot De \qquad (5)$$

$$PR(t1+\Delta t,v)+PL(t1,v)=2P_0 \cdot Te+v \cdot (2t1+\Delta t) \cdot Te+2\alpha \cdot v \qquad (6)$$

When the XY stage 105 moves in the +x direction at the constant speed v (reverse direction), the left edge position PL (t1, −v) and the right edge position PR (t1+$\Delta t$, −v) can be defined by the following equations (7-1) (left edge) and (7-2) (right edge) in the deflection coordinate system of the multiple beams 20.

$$PL(t1,-v)=P_0 \cdot Te-v \cdot t1 \cdot Te-\alpha \cdot v-W \cdot De \qquad (7\text{-}1)$$

$$PR(t1+\Delta t,-v)=P_0 \cdot Te-v \cdot (t1+\Delta t) \cdot Te-\alpha \cdot v+W \cdot De \qquad (7\text{-}2)$$

Therefore, when the XY stage 105 moves in the +x direction at the constant speed v (reverse direction), the difference between the right and left edges ([right edge]−[left edge]) can be defined by the following equation (8). The sum of the right and left edges can be defined by the following equation (9).

$$PR(t1+\Delta t,v)-PL(t1,v)=-v \cdot \Delta t \cdot Te+2W \cdot De \qquad (8)$$

$$PR(t1+\Delta t,v)+PL(t1,v)=2P_0 \cdot Te-v \cdot (2t1+\Delta t) \cdot Te-2\alpha \cdot v \qquad (9)$$

Therefore, the difference A obtained by subtracting the difference between the right and left edges ([right edge]−[left edge]) (equation (8)) in the case of the XY stage 105 moving in the +x direction at the constant speed v (reverse direction) from the difference between the right and left edges ([right edge]−[left edge]) (equation (5)) in the case of the XY stage 105 moving in the −x direction at the constant speed v (positive direction) can be defined by the following equation (10).

$$A=2v \cdot t \cdot Te \qquad (10)$$

The difference B obtained by subtracting the sum of the right and left edges ([right edge]+[left edge]) (equation (9)) in the case of the XY stage 105 moving in the +x direction at the constant speed v (reverse direction) from the sum of the right and left edges ([right edge]+[left edge]) (equation (6)) in the case of the XY stage 105 moving in the −x direction at the constant speed v (positive direction) can be defined by the following equation (11).

$$B=2v \cdot (2t1+\Delta t) \cdot Te+4\alpha \cdot v \qquad (11)$$

If scanning is started when the center position $P_0(x_0, y_0)$ of the mark pattern 12 becomes coincident with the center of the deflection coordinate system of the multiple beams 20, that is, the center A of the irradiation region 34 of the multiple beams 20 so that the left edge of the mark pattern 12 may be irradiated, it can be approximated by t1=0. As a result, the difference B can be defined by the following equation (12).

$$B=2v \cdot \Delta t \cdot Te+4\alpha \cdot v \qquad (12)$$

If the distance (width) to be scanned by the beam is made constant, the scanning time $\Delta t$ is a constant and known value. Moreover, the stage speed v is also a known value. Therefore, if the positions of the right and left edges of the mark pattern 12 are measured in each stage movement direction and at each stage speed while making the combination of the stage movement direction and stage speed v variable, it is possible to obtain the linear error coefficient Te of the DAC amplifier 144 for tracking control and the deflection control delay time $\alpha$ regardless of the linear error De of the DAC amplifier 146.

In the mark scanning step (S108), under the control of the control computer 110, the image acquisition mechanism 150 scans with electron beams the mark pattern 12 arranged on the stage while moving the stage which is for placing thereon a substrate with formed figure patterns. Specifically, in the stage moving step (S106), the XY stage 105 is moved in a set direction and at a set constant speed from the position where the center A of the irradiation region 34 of the multiple beams 20 can pass over the mark pattern 12. Therefore, under the control of the deflection control circuit 128, the image acquisition mechanism 150 places, using the main deflector 208, the mark pattern 12 to be in the irradiation region 34 of the multiple beams 20, and performs scanning the isolated line pattern, using the sub deflector 209, with the center beam 21 of the multiple beams 20 so that the left edge of the mark pattern 12 may be irradiated when the center position $P_0(x_0, y_0)$ of the mark pattern 12 is coincident with the center of the deflection coordinate system of the multiple beams 20, that is, the center A of the irradiation region 34 of the multiple beams 20 in the state where the beam is not deflected by tracking control by the main deflector 208. As described above, the isolated line pattern is scanned with one of the multiple beams 20.

The multi-detector 222 detects the multiple secondary electrons 300 emitted from the mark stage 217 due to the irradiation of the multiple beams 20. The detected data is output to the detection circuit 106 in the order of measurement. In the detection circuit 106, the detected data in analog is converted into digital data by the A-D converter (not shown) and stored in the chip pattern memory 123. The image of the secondary electron obtained when scanned with the center beam 21 of the multiple beams 20 serves as a measured image of the mark pattern 12. Secondary electron data obtained due to irradiation of other beams should be ignored. Thus, the image acquisition mechanism 150 acquires a measured image of the mark pattern 12 formed on the mark stage 217.

In the mark edge position measuring step (S110), the edge position measurement unit 46 (measurement unit) measures the edge position of the mark pattern 12 by scanning the mark pattern 12 disposed on the XY stage 105 with an electron beam (center beam 21) while moving the XY stage 105 for placing thereon the substrate 101 on which figure patterns are formed. Specifically, the edge position measurement unit 46 measures the positions of the right and left edges of the mark pattern 12 from the secondary electron image acquired by the scanning with the center beam 21.

Figure 11:
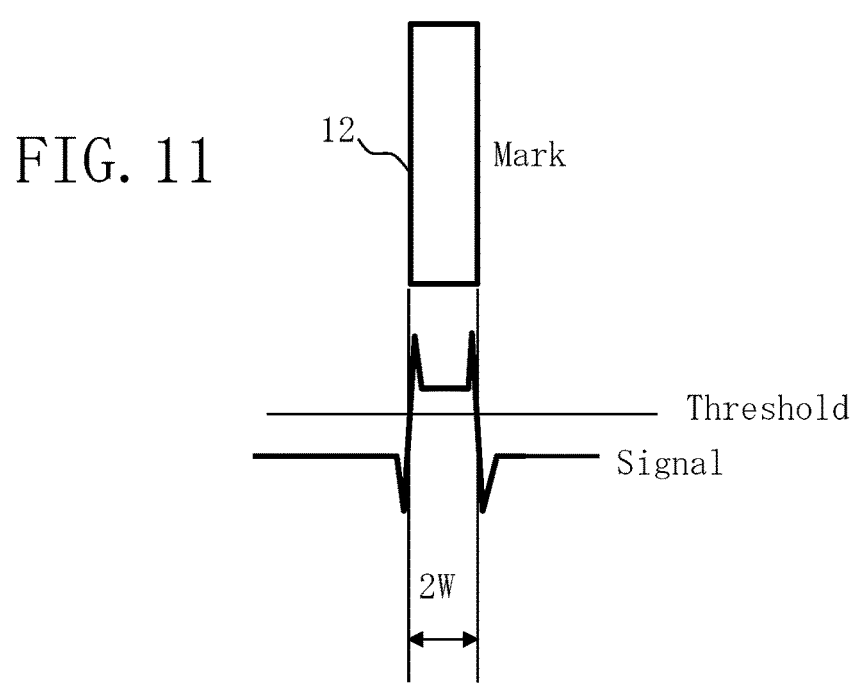
FIG. 11 shows an example of detected strength data on a mark pattern according to the first embodiment.

FIG. 11 shows an example of detected strength data on a mark pattern according to the first embodiment. By scanning the mark pattern 12 from the left side to the right side on the mark stage 217 with the center beam 21, there is difference in the detected data depending on whether the mark pattern exists or not as shown in FIG. 11. By this, the positions of the right and left edges of the mark pattern 12 can be detected.

In the determining step (S112), the determination unit 48 determines whether scanning the mark pattern 12 has been performed at all of a plurality of preset stage speeds. When scanning the mark pattern 12 has been performed at all the preset speeds, it proceeds to the determining step (S116). When scanning the mark pattern 12 has not been performed at all the preset speeds yet, it proceeds to the stage speed changing step (S114).

In the stage speed changing step (S114), the speed setting unit 44 changes the stage speed which is currently set to the one which has not been set yet in a plurality of preset stage speeds.

Then, returning to the stage moving step (S106), each step from the stage moving step (S106) to the stage speed changing step (S114) is repeated until scanning the mark pattern 12 has been performed at all the preset speeds. According to the first embodiment, the movement speed of the stage is made variable so as to measure the edge position of the mark pattern 12 obtained at each speed. Therefore, by repeating each step, it is possible to acquire positions of the right and left edges of the mark pattern 12 at a plurality of stage speeds in one movement direction of the XY stage 105.

In the determining step (S116), the determination unit 49 determines whether scanning the mark pattern 12 has been performed in all the directions of a plurality of preset stage movement directions. When scanning the mark pattern 12 has been performed in all the preset movement directions, it proceeds to the delay time calculating step (S120). When scanning the mark pattern 12 has not been performed in all the preset movement directions yet, it proceeds to the stage movement direction changing step (S118).

In the stage movement direction changing step (S118), the movement direction setting unit 42 changes the stage movement direction which is currently set to the one which has not been set yet in a plurality of preset stage movement directions. Specifically, when the XY stage 105 moves in the ±x direction, the stage movement direction is changed to the +x direction from the −x direction, for example.

Then, returning to the stage speed setting step (S104), each step from the stage speed setting step (S104) to the stage movement direction changing step (S118) is repeated until scanning the mark pattern 12 has been performed at each of all the preset speeds. According to the first embodiment, while moving the XY stage 105 in the positive direction and the negative direction (reverse direction), the edge position of the mark pattern 12 is measured with respect to each direction. By repeating each step, it is possible to acquire positions of the right and left edges of the mark pattern 12 at each of a plurality of stage speeds in both the movement directions of the XY stage 105. Each data on the positions of the right and left edges of the mark pattern 12 at each of a plurality of stage speeds in both the movement directions of the XY stage 105 is output to the delay time table generation circuit 132.

In the delay table generating step (S120), for each movement speed of the XY stage 105 in a plurality of preset movement speeds, the difference calculation unit 60 first calculates the difference between the right and left edges ([right edge]−[left edge]) in the case where the XY stage 105 moves in the −x direction (positive direction) at the constant movement speed v. Since the scanning direction is the x direction, the difference between the right and left edges ([right edge]−[left edge]) is calculated using values in the x direction.

Similarly, for each movement speed of the XY stage 105, the difference calculation unit 60 calculates the difference between the right and left edges ([right edge]−[left edge]) in the case of the XY stage 105 moving in the +x direction (negative direction) at the constant movement speed v. Since the scanning direction is the x direction, the difference between the right and left edges ([right edge]−[left edge]) is calculated using values in the x direction.

Next, for each movement speed of the XY stage 105, the addition unit 62 calculates the sum of the right and left edges ([right edge]−+[left edge]) in the case of the XY stage 105 moving in the −x direction at the constant speed v (positive direction). Since the scanning direction is the x direction, the sum of the right and left edges ([right edge]+[left edge]) is calculated using values in the x direction.

Similarly, for each movement speed of the XY stage 105, the addition unit 62 calculates the sum of the right and left edges ([right edge]+[left edge]) in the case of the XY stage 105 moving in the +x direction at the constant speed v (negative direction). Since the scanning direction is the x direction, the sum of the right and left edges ([right edge]+[left edge]) is calculated using values in the x direction.

Next, for each movement speed of the XY stage 105, the difference calculation unit 61 calculates a difference A by subtracting the difference between the right and left edges ([right edge]−[left edge]) in the case of the XY stage 105 moving in the +x direction at the constant speed v (negative direction) from the difference between the right and left edges ([right edge]−[left edge]) in the case of the XY stage 105 moving in the −x direction at the constant speed v (positive direction).

Next, for each movement speed of the XY stage 105, the difference calculation unit 63 calculates a difference B by subtracting the sum of the right and left edges ([right edge]+[left edge]) in the case of the XY stage 105 moving in the +x direction at the constant speed v (negative direction) from the sum of the right and left edges ([right edge]+[left edge]) in the case of the XY stage 105 moving in the −x direction at the constant speed v (positive direction).

Next, for each movement speed of the XY stage 105, the table generation unit 68 generates a delay table in which obtained differences A and B correspond to each other.

Figure 12:
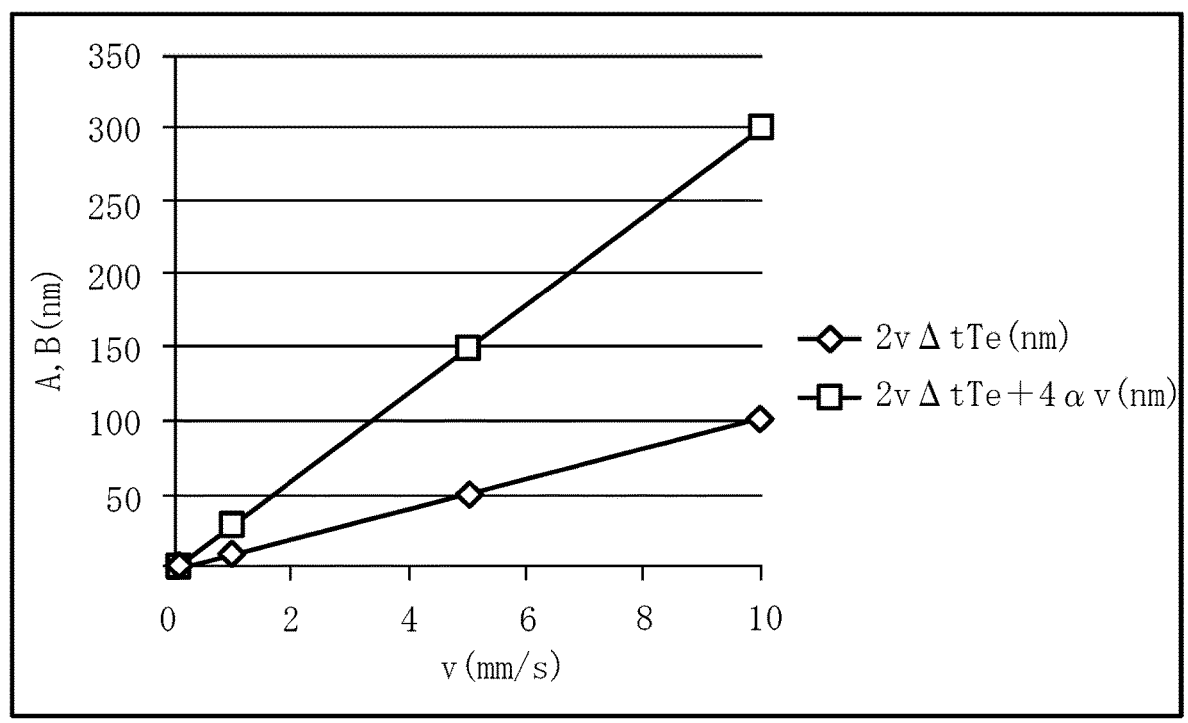
FIG. 12 shows an example of a delay table according to the first embodiment.

FIG. 12 shows an example of a delay table according to the first embodiment. In FIG. 12, the ordinate axis represents the differences A and B, and the abscissa axis represents the movement speed of the XY stage 105. FIG. 12 shows a graph where each of the differences A and B obtained with respect to three movement speeds of the XY stages 105 is approximated in linear proportion. Although the case of linear proportional approximation is shown here, it is not limited thereto. It may be approximated by a function of the second or higher order.

The generated delay table is stored in the storage device 109.

As described above, the delay table used as basic data for calculating a deflection control delay time α is generated in advance before acquiring an image of the substrate 101. After acquiring the delay table, inspection of the substrate 101 is started. First, there is set the movement speed v of the XY stage 105 for acquiring an image used for the inspection. Scanning speed Δt is obtained from the irradiation time to the pixel 36.

In the delay time calculating step (S122), the linear error calculation unit 66 reads the delay table, and calculates a linear error coefficient Te of the DAC amplifier 144 for tracking control corresponding to the movement speed v of the XY stage 105 based on the equation (10).

Here, while changing the position in the x direction of the mark pattern 12, the linear error coefficient Te of the DAC amplifier 144 can be measured even in the state where the XY stage is stopped at each position. Therefore, it is also preferable to use the linear error coefficient Te measured in the state where the XY stage is stopped beforehand.

Next, using information on the positions of the right and left edges of the mark pattern 12 at each of a plurality of stage speeds in both the movement directions of the XY stage 105, the delay time calculation unit 64 calculates a deflection control delay time α which is a delay time to start deflection control occurring in the deflection control system for controlling the deflector. In this case, the deflection control circuit 128 and the DAC amplifiers 144 and 146 are examples of the deflection control system. Specifically, the delay table is read, the difference B corresponding to the movement speed v of the XY stage 105 is calculated, and the obtained linear error coefficient Te is substituted for the equation (12) in order to calculate the deflection control delay time α depending on the movement speed v of the XY stage 105.

In the tracking position calculating step (S202), the tracking position calculation circuit 134 calculates a tracking position x' used as the reference position for performing tracking control by the main deflector 208. Here, coordinates of the substrate 101 to be coincident with the center position A of the irradiation region 34 are calculated.

In the correcting step (S204), the correction circuit 136 (correcting unit) corrects the deflection positions of the multiple beams 20 (electron beam), using the deflection control delay time α. Specifically, the correction circuit 136 corrects the tracking position x' to be coincident with the center position A of the irradiation region 34 of the multiple beams 20. As this correction, the value obtained by multiplying the stage speed v by the deflection control delay time α should be added to the tracking position x'. Thereby, the position delayed by the deflection control delay time α can be made to be the tracking position x'. Moreover, it is preferable for the correction circuit 136 (correcting unit) to also correct a linear error of the DAC amplifier 144, using the linear error coefficient Te. As this correction, the value obtained by multiplying the stage speed v, the tracking time, and the linear error coefficient Te should further be added to the tracking position x' for which the deflection control delay time α has been corrected. By this correction, the position being actually tracked and the position in deflection control are made to be coincident with one another.

By performing correction using the deflection control delay time α, a deflection error due to, for example, mechanical vibration, etc. whose cycle time is slower than the deflection control delay time α can also be corrected simultaneously.

In the image acquiring step (S206), the image acquisition mechanism 150 acquires the image of the figure pattern at the corrected deflection position on the substrate 101. The method of acquiring images is as described above. Then, for example, at the stage when detected data for one chip 332 has been accumulated, it is transmitted, as chip pattern data, to the comparison circuit 108 with information indicating each position from the position circuit 107 as described above.

In the reference image generating step (S208), the reference image generation circuit 112 generates, for each mask die, a reference image based on design data serving as a basis for forming a pattern on the substrate 101, or design pattern data defined in exposure image data of a pattern formed on the substrate 101. Specifically, it operates as described below. First, design pattern data is read from the storage device 109 through the control computer 110, and each figure pattern defined in the read design pattern data is converted into image data of binary or multiple values.

Here, basics of figures defined by design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as figure data, is input to the reference image generation circuit 112, the data is developed into data of each figure. Then, the figure code, the figure dimensions and the like indicating the figure shape in the data of each figure are interpreted. Then, the reference image generation circuit 112 develops each figure data to design pattern image data of binary or multiple values as a pattern to be disposed in a mesh region in units of grids of predetermined quantization dimensions, and outputs the developed data. In other words, the reference image generation circuit 112 reads design data, calculates an occupancy rate occupied by a figure in the design pattern, for each mesh region obtained by virtually dividing an inspection region into grid squares in units of predetermined dimensions, and outputs n-bit occupancy rate data. For example, it is preferable that one mesh region is set as one pixel. Assuming that one pixel has a resolution of $1/2^8(=1/256)$, the occupancy rate in each pixel is calculated by allocating small regions which correspond to the region of figures arranged in the pixel concerned and each of which is corresponding to a 1/256 resolution. Then, 8-bit occupancy rate data is output to the reference circuit 112. The mesh region (inspection pixel) can be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in the analog state continuously changing, it is possible to match/fit the design image data with the measured data by also applying a filtering process to the design image data being image data on the design side whose image intensity (gray value) is represented by digital values. The generated image data of a reference image is input into the comparison circuit 108 to be stored in a memory (not shown) in the comparison circuit 108.

In the comparing step (S210), the comparison circuit 108 compares a measured image measured from the substrate 101 with a corresponding reference image. Here, a mask die image is used as the image to be inspected. The comparison circuit 108 performs position adjustment between a mask die image used as the image to be inspected with a mask die image used as the reference image. For example, the position adjustment is performed using a least-squares method. Then, the position-adjusted image to be inspected and reference image are compared with each other for each pixel. Specifically, the comparison between them is performed for each pixel according to predetermined determination conditions, using a predetermined determination threshold value, in order to determine whether there is a defect such as a shape defect. For example, if a gray scale value difference for each pixel is larger than a determination threshold value Th, it is determined to be a candidate defect. Then, the comparison result is output. The comparison result may be output to the storage device 109, the monitor 117, or the memory 118, or output from the printer 119.

Instead of the die-to-database inspection described above, the die-to-die inspection may be performed. In the case of the die-to-die inspection, data of measured images obtained by capturing identical patterns at different positions on the same substrate 101 are compared. Therefore, the image acquisition mechanism 150 acquires, using the multiple beams 20 (electron beams), measured images being secondary electron images, one of which corresponds to a figure pattern (first figure pattern) and the other of which corresponds to the other figure pattern (second figure pattern), from the substrate 101 on which the identical patterns (first and second figure patterns) are formed at the different positions. In that case, one of the acquired measured images of the figure patterns is treated as a reference image, and the other one is treated as an image to be inspected. The acquired images of the figure pattern (first figure pattern) and the other figure pattern (second figure pattern) may be in the same chip pattern data, or in different chip pattern data. The method for inspection may be the same as that of the die-to-database inspection.

As described above, according to the first embodiment, it is possible to acquire an image while inhibiting deviation of the deflection position of the beam. Thus, the pattern inspection can be performed with great accuracy.

Second Embodiment

The first embodiment described above explains the inspection apparatus using multiple beams, but deviation of the beam deflection position due to deflection control delay described above is not limited to the case of multiple beams. A second embodiment below describes the case of an inspection apparatus using a single beam.

Figure 13:
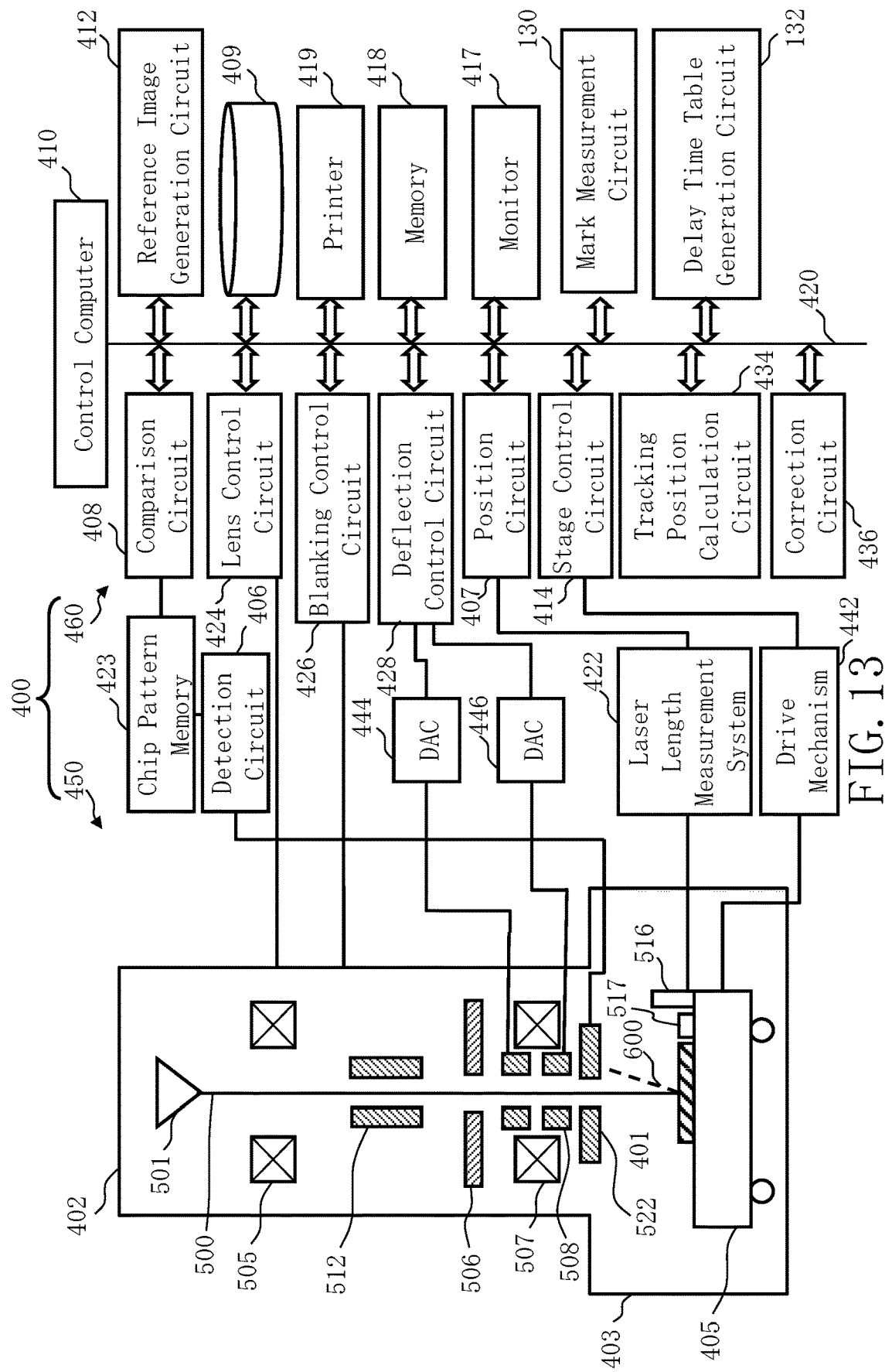
FIG. 13 shows a configuration of an inspection apparatus according to a second embodiment.

FIG. 13 shows a configuration of an inspection apparatus according to the second embodiment. In FIG. 13, an inspection apparatus 400 includes an image acquisition mechanism 450 and a control system circuit 460. The inspection apparatus 400 is an example of an electron beam inspection apparatus. Moreover, the inspection apparatus 400 is an example of an electron beam image acquisition apparatus. The image acquisition mechanism 450 includes an electron beam column 402 (electron optical column), an inspection chamber 403, a detection circuit 406, a chip pattern memory 423, a stage drive mechanism 442, and a laser length measurement system 422. In the electron beam column 402, there are disposed an electron gun 501, a reducing lens 505, a deflector 512, a limiting aperture substrate 506, an objective lens 507, a main deflector 508, a sub deflector 509, and a detector 522.

In the inspection chamber 403, there is disposed an XY stage 405 movable at least in the x-y plane. On the XY stage 405, there is placed a substrate 401 to be inspected. The substrate 401 may be an exposure mask substrate, or a semiconductor substrate such as a silicon wafer. When the substrate 401 is a semiconductor substrate, a plurality of chip patterns (wafer die) is formed on the semiconductor substrate. When the substrate 401 is an exposure mask substrate, a chip pattern is formed on the exposure mask substrate. The chip pattern is configured by a plurality of figure patterns. If a chip pattern formed on the exposure mask substrate is exposure-transferred to the semiconductor substrate a plurality of times, a plurality of chip patterns (wafer die) is formed on the semiconductor substrate. Hereinafter, the case of the substrate 401 being a semiconductor substrate is mainly described below. The substrate 401 is placed with its pattern forming surface facing upward, on the XY stage 405, for example. Moreover, on the XY stage 405, there is disposed a mirror 516 which reflects a laser beam for measuring a laser length emitted from the laser length measurement system 422 disposed outside the inspection chamber 403. Moreover, on the XY stage 405, there is disposed a mark stage 517 on which a mark to be described later is formed. The height positions of the surface of the mark stage 517 and the surface of the substrate 401 are substantially flush with one another. The detector 522 is connected, at the outside of the electron beam column 402, to the detection circuit 406. The detection circuit 406 is connected to the chip pattern memory 423.

In the control system circuit 460, a control computer 410 which controls the whole of the inspection apparatus 400 is connected, through a bus 420, to a position circuit 407, a comparison circuit 408, a reference image generation circuit 412, a stage control circuit 414, a lens control circuit 424, a blanking control circuit 426, a deflection control circuit 428, a mark measurement circuit 130, a delay time table generation circuit 132, a tracking position calculation circuit 434, a correction circuit 436, a storage device 409 such as a magnetic disk drive, a monitor 417, a memory 418, and a printer 419. Moreover, the deflection control circuit 428 is connected to DAC (digital-to-analog conversion) amplifiers 444 and 446. The DAC amplifier 444 is connected to the main deflector 508, and the DAC amplifier 446 is connected to the sub deflector 509.

The chip pattern memory 423 is connected to the comparison circuit 408. The XY stage 405 is driven by the stage drive mechanism 442 under the control of the stage control circuit 414. In the drive mechanism 442, the XY stage 405 can be moved by a drive system, such as a three (x-, y-, and θ-) axis motor, which drives the stage in the directions of x, y, and θ. For example, a step motor can be used as each of these X, Y, and θ motors (not shown). The XY stage 405 is movable in the horizontal direction and the rotation direction by the motors of the X-axis, Y-axis, and θ-axis. The movement position of the XY stage 405 is measured by the laser length measurement system 422, and supplied (transmitted) to the position circuit 407. The laser length measurement system 422 measures the position of the XY stage 405 by receiving a reflected light from the mirror 516, based on the principle of laser interferometry.

One electron beam 500 emitted from the electron gun 501 (emission source) is reduced by the reducing lens 505, and proceeds toward the center hole of the limiting aperture substrate 506. At this stage, if the one electron beam 500 is deflected by the deflector 512, it deviates from the hole in the center of the limiting aperture substrate 506 so as to be blocked by the limiting aperture substrate 506. On the other hand, the one electron beam 500 which was not deflected by the deflector 512 passes through the center hole of the limiting aperture substrate 506 as shown in FIG. 13. Blanking control is provided by ON/OFF of the deflector 512 to control ON/OFF of the beam. Thus, the limiting aperture substrate 506 blocks the one electron beam 500 which was deflected to be in the OFF condition by the deflector 512. Then, the beam for inspection is formed by the one electron beam 500 having been made during a period from becoming "beam ON" to becoming "beam OFF" and having passed through the limiting aperture substrate 506. The one electron beam 500 having passed through the limiting aperture substrate 506 is focused onto the surface of the target object 401 by the objective lens 507 to be a pattern image (beam diameter) of a desired reduction ratio. Then, it is deflected by the main deflector 508 and the sub deflector 509 in order to irradiate the irradiation position on the substrate 401. In such a case, the main deflector 508 deflects the electron beam 500 to the reference position of the mask die to be scanned by the electron beam 500. According to the second embodiment, similarly to the first embodiment, scanning is performed while continuously moving the XY stage 405. Thus, the main deflector 508 performs tracking deflection to further follow the movement of the XY stage 405. Then, the sub deflector 509 deflects the electron beam 500 so that each beam may scan a corresponding region. A secondary electron 600 (dotted line in FIG. 13) including a reflected electron, corresponding to the electron beam 500, is emitted from the substrate 401 due to that a desired position on the substrate 401 is irradiated with the electron beam 500. The secondary electron 600 emitted from the substrate 401 is detected by the detector 522.

In the scanning operation according to the second embodiment, scanning is performed for each mask die 33. One mask die 33 shown in FIG. 4 is scanned in order by the one electron beam 500. Specifically, while the main deflector 508 performs tracking deflection so as to follow the movement of the XY stage 405, the sub deflector 509 scans the inside of the mask die 33 concerned such that each pixel is irradiated with the beam in order, in the state of being tracking-deflected. Thus, according to the second embodiment, since a single beam is used, the scanning operation takes a longer time than that in the first embodiment using the multiple beams 20.

The flowchart showing main steps of the inspection method according to the second embodiment should be the same as that of FIG. 7. The contents of the second embodiment are the same as those of the first embodiment except for what is specifically described below.

In the mark coordinate setting step (S101), the coordinate setting unit 40 sets mark coordinates formed on the mark stage 517.

Figures 14A, 14B:
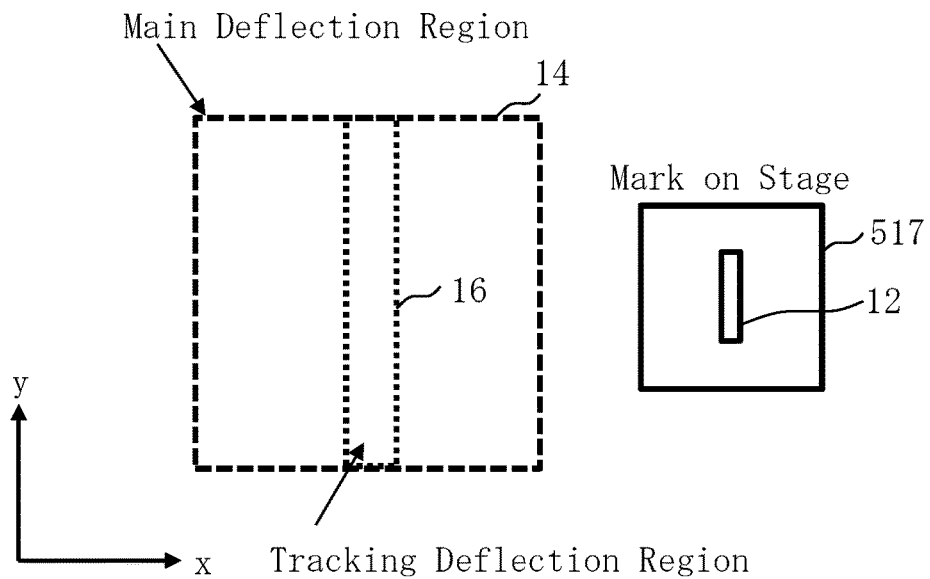
FIGS. 14A and 14B show examples of a deflection region and a mark according to the second embodiment.

FIGS. 14A and 14B show examples of a deflection region and a mark according to the second embodiment. FIG. 14A shows an example of a main deflection region 14 which can be deflected by the main deflector 508, and a tracking deflection region 16 which is tracking-controlled in the ±x direction. FIG. 14B shows the mark pattern 12 on the mark stage 517. Similarly to the first embodiment, an isolated line pattern extending in the direction (e.g., y direction) orthogonal to the stage movement direction is used as the mark pattern 12. Since a single beam is used in the second embodiment, there is no limit to the length in the y direction of the mark pattern 12. The width size in the x direction of the mark pattern 12 may be 2W similarly to the first embodiment. However, the value of W may be different from that used in the first embodiment. For example, the center position $P_0(x_0, y_0)$ of the mark pattern 12 may be used as the mark coordinates. Since the x coordinate (coordinate in the stage movement direction) is mainly needed as the mark coordinate, the y coordinate position may be deviated from the center of the mark pattern 12.

In the stage movement direction setting step (S102), the movement direction setting unit 42 sets the movement direction of the XY stage 405 in the case of scanning the mark pattern 12. Here, since it is on the assumption that the XY stage 405 moves in the ±x direction, for example, +x direction or −x direction is set.

In the stage speed setting step (S104), the speed setting unit 44 sets the continuous movement speed of the XY stage 405. Since the mark pattern 12 is scanned while making the movement speed of the continuously moving XY stage 405 variable, here, one in a plurality of preset movement speeds is set.

In the stage moving step (S106), under the control of the stage control circuit 414, the drive mechanism 442 continuously moves (constant speed movement) the XY stage 405 in a set direction. The XY stage 405 is moved at a constant speed in a set direction from the center of the deflection coordinate system of the electron beam 500, that is from the position where the tracking deflection region 16 in the center portion of the main deflection region 14 deflectable by the main deflector 208 can pass over the mark pattern 12.

In the mark scanning step (S108), under the control of the control computer 410, the image acquisition mechanism 450 scans with the electron beam 500 the mark pattern 12 arranged on the stage while moving the stage which is for placing thereon a substrate with formed figure patterns.

Figures 15A, 15B, 15C:
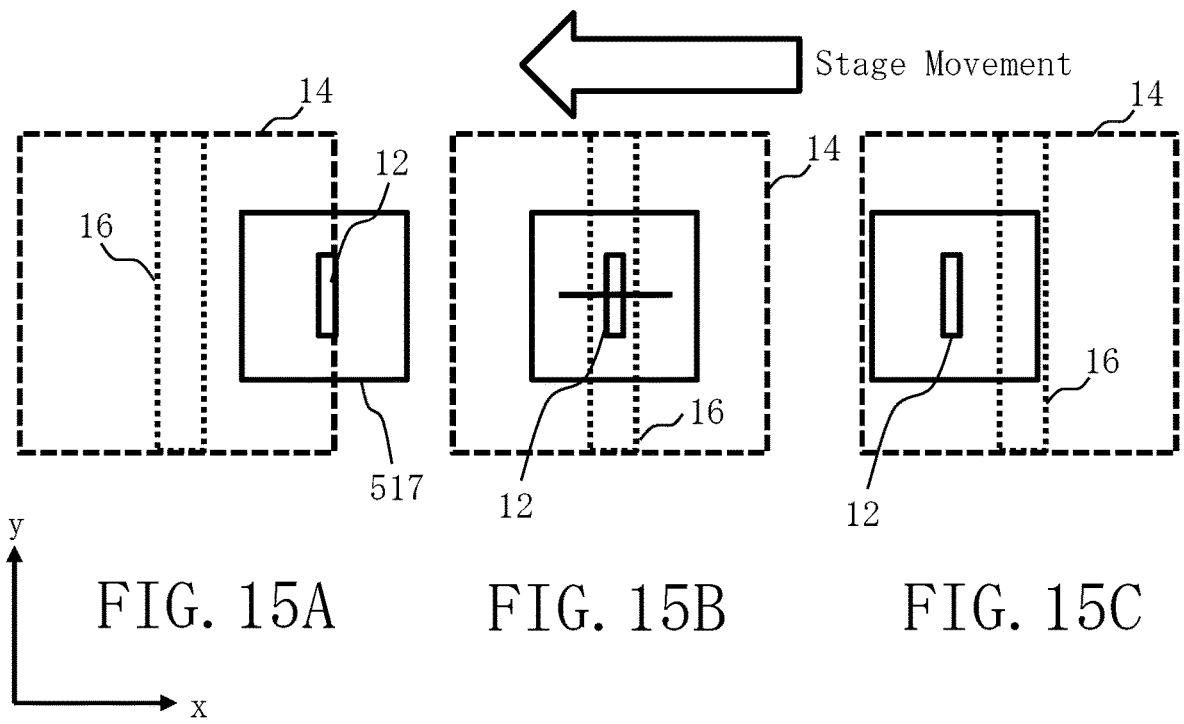
FIGS. 15A to 15C illustrate a stage movement and a mark scanning method according to the second embodiment.

FIGS. 15A to 15C illustrate a stage movement and a mark scanning method according to the second embodiment. The examples of FIG. 15A to 15C show positional relationship between the mark pattern 12 and the tracking deflection region 16 at the central part of the main deflection region 14 when the XY stage 405 moves in the −x direction at a constant speed v. If the XY stage 405 moves in the −x direction at the constant speed v from the position where the mark pattern 12 is located away in the x direction from the tracking deflection region 16 as shown in FIG. 15A, there comes a moment when the center in the x direction of the tracking deflection region 16 becomes coincident with the center position $P_0(x_0, y_0)$ of the mark pattern 12 as shown in FIG. 15B. Then, due to further movement of the XY stage 405, the mark pattern 12 moves to the position away in the −x direction from the tracking deflection region 16 as shown in FIG. 15C. Under the control of the deflection control circuit 428, the image acquisition mechanism 450 performs scanning using the sub deflector 509 such that the left edge of the mark pattern 12 is irradiated when the center position $P_0(x_0, y_0)$ of the mark pattern 12 becomes coincident with the center of the deflection coordinate system of the electron beam 500, that is the center in the x direction of the tracking deflection region 16 in the state where the beam is not deflected by tracking control of the main deflector 508.

The detector 522 detects the secondary electron 600 emitted from the mark stage 517 by irradiation of the electron beam 500. Detected data is output to the detection circuit 406 in order of measurement. In the detection circuit 406, the detected data in analog form is converted into digital data by an A-D converter (not shown), and stored in the chip pattern memory 423. The image of the secondary electron obtained when scanned by the electron beam 500 is to be regarded as a measured image of the mark pattern 12. Thus, the image acquisition mechanism 450 acquires a measured image of the mark pattern 12 formed on the mark stage 517.

In the mark edge position measuring step (S110), the edge position measurement unit 46 (measurement unit) measures the edge position of the mark pattern 12 by scanning the mark pattern 12 arranged on the XY stage 405 with the electron beam 500 while moving the XY stage 405 for placing thereon the substrate 401 on which figure patterns are formed. Specifically, the edge position measurement unit 46 measures the positions of the right and left edges of the mark pattern 12 from the secondary electron image acquired by the scanning with the electron beam 500.

Then, each step from the stage speed setting step (S104) to the stage movement direction changing step (S118) is repeated until measuring the positions of the right and left edges of the mark pattern 12 at each of a plurality of stage speeds in both the movement directions of the XY stage 405 is completed. The contents of each step from the stage speed setting step (S104) to the stage movement direction changing step (S418) are the same as those in the first embodiment. However, the center beam 21 of the multiple beams 20 should be read as the electron beam 500, and signs of other configuration elements should be replaced with those correspondingly described in the second embodiment. Each data of the positions of the right and left edges of the mark pattern 12 at each of a plurality of stage speeds in both the movement directions of the XY stage 405 is output to the delay time table generation circuit 132.

The contents of the delay table generating step (S120) are the same as those in the first embodiment. However, the sign of each configuration should be replaced with that correspondingly described in the second embodiment. The generated delay table is stored in the storage device 409.

As described above, the delay table used as basic data for calculating a deflection control delay time α is generated in advance before acquiring an image of the substrate 401. After acquiring the delay table, inspection of the substrate 401 is started. First, there is set the movement speed v of the XY stage 405 for acquiring an image used for the inspection. Scanning speed Δt is obtained from the irradiation time to the pixel 36.

In the delay time calculating step (S122), the linear error calculation unit 66 reads the delay table, and calculates a linear error coefficient Te of the DAC amplifier 444 for tracking control corresponding to the movement speed v of the XY stage 405 based on the equation (10).

Here, while changing the position in the x direction of the mark pattern 12, the linear error coefficient Te of the DAC amplifier 444 can be measured even in the state where the XY stage is stopped at each position. Therefore, it is also preferable to use the linear error coefficient Te measured in the state where the XY stage is stopped beforehand.

Next, using information on the positions of the right and left edges of the mark pattern 12 at each of a plurality of stage speeds in both the movement directions of the XY stage 405, the delay time calculation unit 64 calculates a deflection control delay time α which is a delay time to start deflection control occurring in the deflection control system for controlling the deflector. In this case, the deflection control circuit 428 and the DAC amplifiers 444 and 446 are examples of the deflection control system. Specifically, the delay table is read, the difference B corresponding to the movement speed v of the XY stage 405 is calculated, and the obtained linear error coefficient Te is substituted for the equation (12) in order to calculate the deflection control delay time α depending on the movement speed v of the XY stage 405.

In the tracking position calculating step (S202), the tracking position calculation circuit 434 calculates a tracking position x' used as the reference position for performing tracking control by the main deflector 508. Here, coordinates of the substrate 401 to be coincident with the center position (tracking position x') of the tracking deflection region 16 to be deflected by the main deflector 508 are calculated.

In the correcting step (S204), the correction circuit 436 (correcting unit) corrects the deflection position of the electron beam 500, using the deflection control delay time α. Specifically, the correction circuit 436 may add the value obtained by multiplying the stage speed v by the deflection control delay time α to the tracking position x'. Thereby, the position delayed by the deflection control delay time α can be made to be the tracking position x'. Moreover, it is preferable for the correction circuit 436 (correcting unit) to also correct a linear error of the DAC amplifier 444, using the linear error coefficient Te. As this correction, the value obtained by multiplying the stage speed v, the tracking time, and the linear error coefficient Te should further be added to the tracking position x' for which the deflection control delay time α has been corrected. By this correction, the position being actually tracked and the position in deflection control are made to be coincident with one another.

By performing correction using the deflection control delay time α, a deflection error due to, for example, mechanical vibration, etc. whose cycle time is slower than the deflection control delay time α can also be corrected simultaneously.

In the image acquiring step (S206), the image acquisition mechanism. 450 acquires the image of the figure pattern at the corrected deflection position on the substrate 401. The method of acquiring images is as described above. Then, for example, at the stage when detected data for one chip 332 has been accumulated, it is transmitted, as chip pattern data, to the comparison circuit 408 with information indicating each position from the position circuit 407 as described above.

In the reference image generating step (S208), the reference image generation circuit 412 generates, for each mask die, a reference image based on design data serving as a basis for forming patterns on the substrate 401, or design pattern data defined in exposure image data of patterns formed on the substrate 401. The generation method is the same as that of the first embodiment.

In the comparing step (S210), the comparison circuit 408 compares a measured image measured from the substrate 401 with a corresponding reference image. The contents of the comparing step (S210) are the same as those of the first embodiment.

As described above, according to the second embodiment, it is possible to acquire an image while inhibiting deviation of the deflection position of the single beam. Thus, the pattern inspection can be performed with great accuracy.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107 (407), the comparison circuit 108 (408), the reference image generation circuit 112 (412), the mark position measurement circuit 130, the delay time table generation circuit 132, the tracking position calculation circuit 134 (434), the correction circuit 136 (436), etc. may be configured by at least one processing circuitry described above.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other pattern inspection apparatus and pattern inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam image acquisition apparatus comprising:
    a deflector configured to deflect an electron beam;
    a deflection control system configured to control the deflector;
    a measurement circuitry configured to measure, while moving a stage for placing thereon a substrate on which a figure pattern is formed, an edge position of a mark pattern arranged on the stage by scanning the mark pattern with an electron beam;
    a delay time calculation circuitry configured to calculate, using information on the edge position, a deflection control delay time which is a delay time to start deflection control occurring in the deflection control system;
    a correction circuitry configured to correct, using the deflection control delay time, a deflection position of the electron beam; and
    an image acquisition mechanism configured to include the deflector and acquire an image of the figure pattern at a corrected deflection position on the substrate.

2. The apparatus according to claim 1, wherein, using multiple beams as the electron beam and using an isolated line pattern of a size smaller than a pitch between beams of the multiple beams as the mark pattern, the isolated line pattern is scanned with one of the multiple beams.

3. The apparatus according to claim 1, wherein a movement speed of the stage is made variable so as to measure the edge position of the mark pattern obtained at each the movement speed.

4. The apparatus according to claim 1, wherein, while moving the stage in a positive direction and a negative direction, the edge position of the mark pattern is measured with respect to the positive direction and the negative direction.

5. The apparatus according to claim 4, further comprising:
    an addition circuitry configured to calculate a first sum of both edge positions of the mark pattern in a case where the stage moves in the positive direction at a constant speed.

6. The apparatus according to claim 5, wherein the addition circuitry calculates a second sum of the both edge positions of the mark pattern in a case where the stage moves in the negative direction at the constant speed.

7. The apparatus according to claim 6, further comprising:
    a difference calculation circuitry configured to calculate a difference by subtracting the second sum from the first sum.

8. The apparatus according to claim 7, wherein the delay time calculation circuitry calculates the deflection control delay time by using the difference.

9. The apparatus according to claim 1, wherein the delay time calculation circuitry calculates the deflection control delay time depending on a movement speed of the stage.

10. An electron beam image acquisition method comprising:
    measuring, while moving a stage to place thereon a substrate on which a figure pattern is formed, an edge position of a mark pattern arranged on the stage by scanning the mark pattern with an electron beam deflected by a deflector;
    calculating, using information on the edge position, a deflection control delay time which is a delay time to start deflection control occurring in a deflection control system to control the deflector;
    correcting a deflection position of the electron beam by using the deflection control delay time; and
    acquiring an image of the figure pattern at a corrected deflection position on the substrate.

* * * * *